(12) United States Patent
Rueckes et al.

(10) Patent No.: US 7,045,421 B2
(45) Date of Patent: May 16, 2006

(54) PROCESS FOR MAKING BIT SELECTABLE DEVICES HAVING ELEMENTS MADE WITH NANOTUBES

(75) Inventors: Thomas Rueckes, Boston, MA (US); Venkatachalam C. Jaiprakash, Fremont, CA (US); Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 58 days.

(21) Appl. No.: 10/824,706

(22) Filed: Apr. 15, 2004

(65) Prior Publication Data

US 2005/0059210 A1    Mar. 17, 2005

Related U.S. Application Data

(60) Provisional application No. 60/464,472, filed on Apr. 22, 2003.

(51) Int. Cl.
*H01L 21/00*    (2006.01)

(52) U.S. Cl. .................... 438/257; 438/99; 438/209

(58) Field of Classification Search ............... 438/99, 438/209, 257, 754, 53, 20

See application file for complete search history.

(56) References Cited

U.S. PATENT DOCUMENTS

| | | |
|---|---|---|
| 3,448,302 A | 6/1969 | Shanefield |
| 4,845,533 A | 7/1989 | Pryor et al. |
| 4,853,893 A | 8/1989 | Eaton et al. |
| 4,876,667 A | 10/1989 | Ross et al. |
| 4,888,630 A | 12/1989 | Paterson |
| 5,198,994 A | 3/1993 | Natori |
| 6,044,008 A | 3/2000 | Choi |
| 6,048,740 A | 4/2000 | Hsu et al. |
| 6,128,214 A | 10/2000 | Kuekes et al. |

(Continued)

FOREIGN PATENT DOCUMENTS

WO    WO 01/03208    1/2001

(Continued)

OTHER PUBLICATIONS

Ajayan, P.M., et al., "Nanometre-size tubes of carbon," Rep. Prog. Phys., 1997, vol. 60, pp. 1025-1062.

(Continued)

*Primary Examiner*—Laura M. Schillinger
(74) *Attorney, Agent, or Firm*—Wilmer Cutler Pickering Hale and Dorr LLP

(57) ABSTRACT

A method is used to make a bit selectable device having nanotube memory elements. A structure having at least two transistors is provided, each with a drain and a source with a defined channel region therebetween, each transistor further including a gate over said channel. A trench is formed between one of the source and drain of a first transistor and one of the source and drain of a second transistor. An electrical communication path is formed in the trench between one of the source and drain of a first transistor and one of the source and drain of a second transistor. A defined pattern of nanotube fabric is provided over at least a horizontal portion of the structure and extending into the trench. An electrode is provided in the trench. A pattern of nanotube fabric is suspended so that at least a portion is vertically suspended in spaced relation to the vertical walls of the trench and positioned so that the vertically suspended defined pattern of nanotube fabric is electromechanically deflectable into electrical communication with one of the drain and source of a first transistor and one of the source and drain of a second transistor.

7 Claims, 19 Drawing Sheets

U.S. PATENT DOCUMENTS

| | | | |
|---|---|---|---|
| 6,159,620 A | 12/2000 | Heath et al. | |
| 6,183,714 B1 | 2/2001 | Smalley et al. | |
| 6,198,655 B1 | 3/2001 | Heath et al. | |
| 6,221,330 B1 | 4/2001 | Moy et al. | |
| 6,232,706 B1 | 5/2001 | Dai et al. | |
| 6,445,006 B1* | 9/2002 | Brandes et al. | 257/76 |
| 6,518,156 B1 | 2/2003 | Chen | |
| 6,548,841 B1 | 4/2003 | Frazier et al. | |
| 6,559,468 B1 | 5/2003 | Kuekes et al. | |
| 6,574,130 B1* | 6/2003 | Segal et al. | 365/129 |
| 6,643,165 B1* | 11/2003 | Segal et al. | 365/151 |
| 6,645,628 B1* | 11/2003 | Shiffler et al. | 428/408 |
| 6,673,424 B1 | 1/2004 | Lindsay | |
| 6,706,402 B1* | 3/2004 | Rueckes et al. | 428/408 |
| 6,750,471 B1 | 6/2004 | Bethune et al. | |
| 6,759,693 B1 | 7/2004 | Vogeli et al. | |
| 6,774,052 B1 | 8/2004 | Vogeli et al. | |
| 6,781,166 B1 | 8/2004 | Lieber et al. | |
| 6,784,028 B1 | 8/2004 | Rueckes et al. | |
| 6,803,840 B1 | 10/2004 | Hunt et al. | |
| 6,809,465 B1 | 10/2004 | Jin | |
| 6,835,591 B1* | 12/2004 | Rueckes et al. | 438/99 |
| 6,836,424 B1* | 12/2004 | Segal et al. | 365/129 |
| 6,919,592 B1* | 7/2005 | Segal et al. | 257/209 |
| 6,942,921 B1* | 9/2005 | Rueckes et al. | 428/408 |
| 2002/0130311 A1 | 9/2002 | Lieber et al. | |
| 2002/0130353 A1 | 9/2002 | Lieber et al. | |
| 2002/0172963 A1 | 11/2002 | Kelley et al. | |
| 2002/0179434 A1 | 12/2002 | Dai et al. | |
| 2003/0021141 A1* | 1/2003 | Segal et al. | 365/129 |
| 2003/0021966 A1* | 1/2003 | Segal et al. | 428/209 |
| 2003/0022428 A1* | 1/2003 | Segal et al. | 438/209 |
| 2003/0091825 A1* | 5/2003 | Shiffler et al. | 428/408 |
| 2003/0124325 A1 | 7/2003 | Rueckes et al. | |
| 2003/0165074 A1* | 9/2003 | Segal et al. | 365/153 |
| 2003/0198812 A1* | 10/2003 | Rueckes et al. | 428/408 |
| 2003/0199172 A1* | 10/2003 | Rueckes et al. | 438/754 |
| 2003/0234407 A1 | 12/2003 | Vogeli et al. | |
| 2003/0236000 A1 | 12/2003 | Vogeli et al. | |
| 2004/0085805 A1* | 5/2004 | Segal et al. | 365/145 |
| 2004/0159833 A1* | 8/2004 | Rueckes et al. | 257/17 |
| 2004/0164289 A1 | 8/2004 | Rueckes et al. | |
| 2004/0175856 A1 | 9/2004 | Jaiprakash et al. | |
| 2004/0181630 A1 | 9/2004 | Jaiprakash et al. | |
| 2004/0191978 A1 | 9/2004 | Rueckes et al. | |
| 2004/0214366 A1* | 10/2004 | Segal et al. | 438/53 |
| 2004/0214367 A1* | 10/2004 | Segal et al. | 438/53 |
| 2005/0041465 A1 | 2/2005 | Rueckes et al. | |
| 2005/0041566 A1 | 2/2005 | Rueckes et al. | |
| 2005/0047244 A1* | 3/2005 | Rueckes et al. | 365/222 |
| 2005/0047277 A1 | 3/2005 | Rueckes et al. | |
| 2005/0056825 A1* | 3/2005 | Bertin et al. | 257/20 |
| 2005/0056866 A1* | 3/2005 | Bertin et al. | 257/213 |
| 2005/0056877 A1* | 3/2005 | Rueckes et al. | 257/300 |
| 2005/0058834 A1* | 3/2005 | Rueckes et al. | 428/408 |
| 2005/0059176 A1* | 3/2005 | Rueckes et al. | 438/20 |
| 2005/0059210 A1* | 3/2005 | Rueckes et al. | 438/257 |
| 2005/0062035 A1* | 3/2005 | Bertin et al. | 257/20 |
| 2005/0062062 A1* | 3/2005 | Bertin et al. | 257/200 |
| 2005/0062070 A1* | 3/2005 | Bertin et al. | 257/213 |
| 2005/0063210 A1* | 3/2005 | Segal et al. | 365/103 |
| 2005/0063244 A1* | 3/2005 | Bertin et al. | 365/232 |
| 2005/0074926 A1* | 4/2005 | Bertin et al. | 438/129 |
| 2005/0095938 A1* | 5/2005 | Rosenberger et al. | 442/194 |
| 2005/0237781 A1* | 10/2005 | Bertin et al. | 365/145 |

FOREIGN PATENT DOCUMENTS

| | | |
|---|---|---|
| WO | WO 01/44796 A1 | 6/2001 |
| WO | WO 2003/091486 | 11/2003 |
| WO | WO 2004/065655 | 8/2004 |
| WO | WO 2004/065657 | 8/2004 |
| WO | WO 2004/065671 | 8/2004 |

OTHER PUBLICATIONS

Ami, S. et al., "Logic gates and memory cells based on single $C_{60}$ electromechanical transistors," Nanotechnology, 2001, vol. 12, pp. 44-52.

Avouris, Ph., "Carbon nanotube electronics," Carbon, 2002, vol. 14, pp. 1891-1896.

Casavant, M.J. et al., "Neat macroscopic membranes of aligned carbon nanotubes," Journal of Appl. Phys., 2003, vol. 93(4), pp. 2153-2156.

Choi, W.-B. et al., "Carbon-nanotube-based nonvolatile memory with oxide-nitride-film and nanoscale channel," Appl. Phys. Lett., 2003, vol. 82(2), pp. 275-277.

Cui, J.B. et al., "Carbon Nanotube Memory Devices of High Charge Storage Stability," Appl. Phys. Lett., 2002, vol. 81(17), pp. 3260-3262.

Dai, H. et al., "Controlled Chemical Routes to nanotube Architectures, Physics, and Devices," J. Phys. Chem . B, 199, vol. 103, pp. 111246-11255.

Dehon, A., "Array-Based Architecture for FET-Based, Nanoscale Electronics," IEEE Transactions on Nanotechnology, 2003, vol. 2(1), pp. 23-32.

Dequesnes, M. et al., "Calculation of pull-in voltages for carbon-nanotube-based nanoelectromechanical switches," Nanotechnology, 2002, vol. 13, pp. 120-131.

Dequesnes, M. et al., "Simulation of carbon nanotube-based nanoelectromechanical switches," Computational Nanoscience and Nanotechnology, 2002, pp. 383-386.

Fan, S. et al., "Carbon nanotube arrays on silicon substrates and their possible application," Physica E, 2000, vol. 8, pp. 179-183.

Farajian, A. A. et al., "Electronic transport through bent carbon nanotubes: Nanoelectromechanical sensors and switches," Phys. Rev. B, 2003, vol. 67, pp. 205423-1=205423-6.

Fischer, J.E. et al., "Magnetically aligned single wall carbon nanotube films: Preferred orientation and anisotropic transport properties," Journal of Appl. Phys., 2003, vol. 93(4), pp. 2157-2163.

Franklin, N. R. et al., "Integration of suspended carbon nanotube arrays into electronic devices and electromechanical systems," Appl. Phys. Lett., 2002, vol. 81 (5), pp. 913-915.

Fuhrer, M.S. et al., "High-Mobility Nanotube Transistor Memory," Nano Letters, 2002, vol. 2(7), pp. 755-759.

Homma, Y. et al., "Growth of Suspended Carbon Nanotubes Networks on 100-nm-scale Silicon Pillars," Appl. Phys. Lett., 2002, vol. 81(12), pp. 2261-2263.

Kinaret, J.M. et al., "A carbon-nanotube-based nanorelay," Appl. Phys. Lett., 2003, vol. 82(8), pp. 1287-1289.

Lee, K.-H. et al., "Control of growth orientation for carbon nanotubes," Appl, Phys. Lett., 2003, vol. 82(3), pp. 448-450.

Radosavlievic, M. et al., "Nonvolatile molecular memory elements based on ambipolar nanotube field effect transistors," Nano Letters, 2002, vol. 2(7), pp. 761-764.

Robinson, L.A.W., "Self-Aligned Electrodes for Suspended Carbon Nanotube Structures," Microelectronic Engineering, 2003, vol. 67-68, pp. 615-622.

Rueckes, T., et al., "Carbon Nanotube-Based Nonvolatile Random Access Memory for Molecular Computing" Science, 2000, vol. 289, pp. 94-97.

Soh, H. T. et al., "Integrated nanotube circuits: Controlled growth and ohmic contacting of single-walled carbon nanotubes," Appl. Phys. Lett., 1999, vol. 75(5), pp. 627-629.

Sreekumar, T.V., et al., "Single-wall Carbon Nanotube Films", Chem. Mater. 2003, vol. 15, pp. 175-178.

Tans, S. et al., "Room-temperature based on a single carbon nanotube," Nature, 1998.vol. 393, pp. 49-52.

Tour, J. M. et al., "NanoCell Electronic Memories," J. Am. Chem. Soc., 2003, vol. 125, pp. 13279-13283.

Verissimo-Alves, M. et al., "Electromechanical effects in carbon nanotubes: Ab initio and analytical tight-binding calculations," Phys. Rev. B, 2003, vol. 67, pp. 161401-1=161401-4.

Wolf, S., Silicon Processing for the VLSI Era; vol. 2—Process Integration, Multi-Level-Interconnect Technology for VLSI and ULSI, 1990, Section 4.3 Materials for Multilevel Interconnect Technologies, pp. 189-191, Lattice Press, Sunset Beach.

Wolf, S., Silicon Processing for the VLSI Era; vol. 2—Process Integration, 1990, Section 4.7 Manufacturing Yield and Reliability Issues of VLSI Interconnects, pp. 260-273, Lattice Press, Sunset Beach.

Zhan, W., et al., Microelectrochemical Logic Circuits,: J. Am. Chem. Soc., 2003, vol. 125, pp. 9934-9935.

* cited by examiner

400

500

600

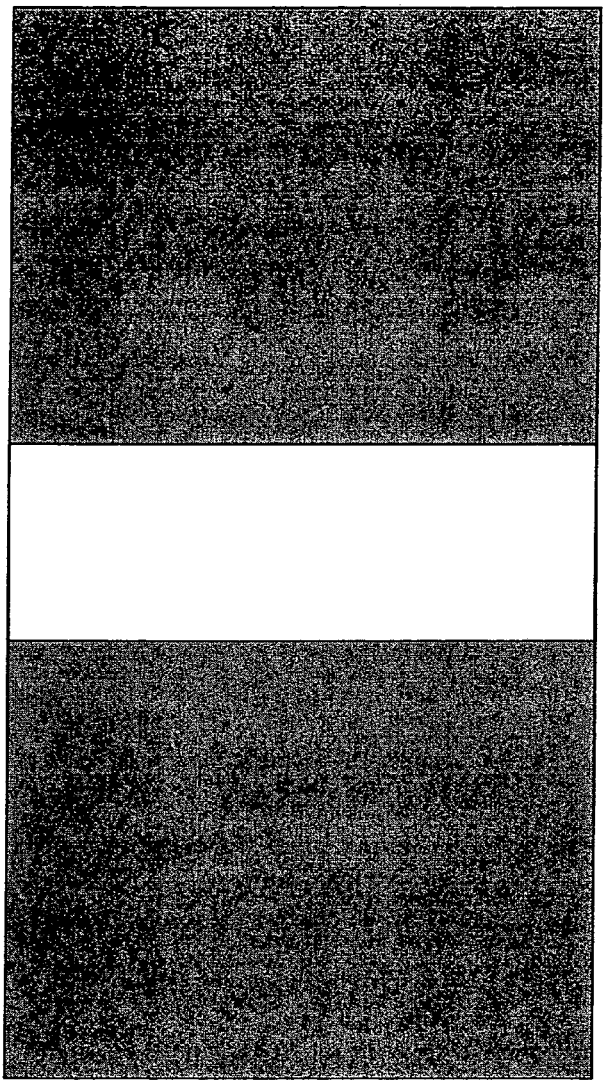
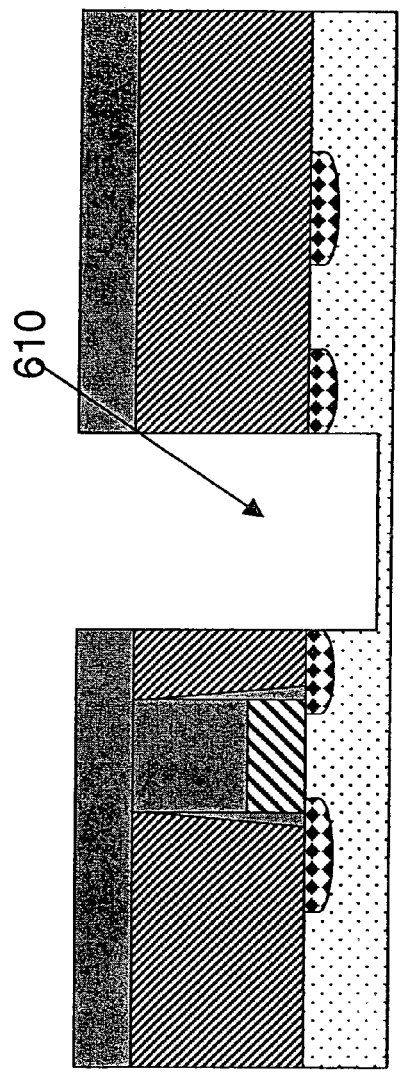
Figure 6A

700

800

900

2100

2200

2300

2400

PROCESS FOR MAKING BIT SELECTABLE DEVICES HAVING ELEMENTS MADE WITH NANOTUBES

CROSS-REFERENCE TO RELATED APPLICATIONS

This application claims priority under 35 USC § 119(e) to the following application, which is hereby incorporated by reference in its entirety:

"Process For Making Bit Selectable Devices Having Elements Made With Nanotubes," U.S. Provisional Patent Application Ser. No. 60/464,472, filed on Apr. 22, 2003.

The following applications are related and are hereby incorporated by reference in their entirety:

"Electro-Mechanical Switches and Memory Cells Using Horizontally-Disposed Nanofabric Articles and Methods of Making the Same", U.S. Provisional Patent Application Ser. No. 60/446,783, filed on Feb. 12, 2003;

"Electro-Mechanical Switches and Memory Cells Using Vertically-Disposed Nanofabric Articles and Methods of Making the Same", U.S. Provisional Patent Application Ser. No. 60/446,786, filed on Feb. 12, 2003;

"Combined Three Terminal and Four Terminal Nanotube/FET Structures", U.S. Provisional Patent Application Ser. No. 60/512,602, filed on Oct. 16, 2003;

"NRAM Bit Selectable Two-Device Nanotube Array", U.S. application Ser. No. 10/810,962, filed on Mar. 26, 2004;

"NRAM Byte/Block Released Bit Selectable One-Device Nanotube Array", U.S. application Ser. No. 10/810,963, filed on Mar. 26, 2004;

"Single Transistor With Integrated Nanotube (NT-FET)", U.S. application Ser. No. 10/811,191, filed on Mar. 26, 2004; and "Nanotube-On-Gate FET Structures And Applications", U.S. application Ser. No. 10/811,356, filed on Mar. 26, 2004.

BACKGROUND

1. Technical Field

The present application relates to the manufacture of devices using transistors and nanotube switching elements and in which the nanotube switching element records the informational state of the device.

2. Discussion of Related Art

Currently, most memory storage devices utilize a wide variety of energy dissipating devices which employ the confinement of electric or magnetic fields within capacitors or inductors respectively. Examples of state of the art circuitry used in memory storage include FPGA, ASIC, CMOS, ROM, PROM, EPROM, EEPROM, DRAM, MRAM and FRAM, as well as dissipationless trapped magnetic flux in a superconductor and actual mechanical switches, such as relays.

An FPGA (Field Programmable Gate Array) is a programmable logic device (PLD), a programmable logic array (PLA), or a programmable array logic (PAL) with a high density of gates, containing up to hundreds of thousands of gates with a wide variety of possible architectures. The ability to modulate (i.e. effectively to open and close) electrical circuit connections on an IC (i.e. to program and reprogram) is at the heart of the FPGA (Field programmable gate array) concept.

An ASIC (Application Specific Integrated Circuit) chip is custom designed for a specific application rather than a general-purpose chip such as a microprocessor. The use of ASICs can improve performance over general-purpose CPUs, because ASICs are "hardwired" to do a specific job and are not required to fetch and interpret stored instructions.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM (Electrically-erasable programmable read-only memories) has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

EEPROMS are widely used within the computer industry to store a BIOS (basic input-output system) for a computer, sensor, or processing device, allowing it to load data and system instructions from other storage media when the unit receives first power after being in a quiescent state. The size of the BIOS is typically minimized in design because of the high cost of flash memory.

DRAM (dynamic random access memory) stores charge on capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiple writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994, 6,048,740; and 6,044,008.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and poor reliability and has not reached a state of commercialization. See U.S. Pat. Nos. 3,448,302; 4,845,533; and 4,876,667.

Wire crossbar memory (MWCM) has also been proposed. See U.S. Pat. Nos. 6,128,214; 6,159,620; and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul. 2000. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The use of an electromechanical bi-stable device for digital information storage has also been suggested (c.f. U.S. Pat. No. 4,979,149: Non-volatile memory device including a micro-mechanical storage element).

The creation and operation of a bi-stable nano-electro-mechanical switches based on carbon nanotubes (including mono-layers constructed thereof) and metal electrodes has been detailed in a previous patents and patent application of Nantero, Inc. (U.S. Ser. Nos. 09/915,093, 09/915,173, 09/915,095, 10/033,323, 10/033,032, 10/128,118, 10/128,117, 10/341,005, 10/341,055, 10/341,054, 10/341,130, 60/446,783 and 60/446,786, add 41 the contents of which are hereby incorporated by reference in their entireties).

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

A typical nanotube device is composed of a nanofabric as described in U.S. patent application Ser. No. 09/915,093, Electromechanical Memory Array Using Nanotube Ribbons and Method for Making Same, filed Jul. 25, 2001 (NAN-1); U.S. patent application Ser. No. 09/915,173, Electromechanical Memory Having Cell Selection Circuitry Constructed with Nanotube Technology, filed Jul. 25, 2001 (NAN-2);

U.S. patent application Ser. No. 09/915,095, Hybrid Circuit Having Nanotube Electromechanical Memory, Jul. 25, 2001 (NAN-3); U.S. patent application Ser. No. 10/033,323, Electromechanical Three-Trace Junction Devices, filed Dec. 28, 2001 (NAN-4); U.S. patent application Ser. No. 10/033,032, Methods Of Making Electromechanical Three-Trace Junction Devices, filed Dec. 28, 2001 (NAN-5); U.S. patent application Ser. No. 10/128,118, Nanotube Films And Articles, filed Apr. 23, 2002, (NAN-6); U.S. patent application Ser. No. 10/128,117, Methods Of Nanotube Films And Articles, filed Apr. 23, 2002 (NAN-7); U.S. patent application Ser. No. 10/341,005, Methods Of Making Carbon Nanotube Films, Layers, Fabrics, Ribbons, Elements And Articles, filed Jan. 13, 2003 (NAN-15); U.S. patent application Ser. No. 10/341,055, Methods Of Using Thin Metal Layers To Make Carbon Nanotube Films, Layers, Fabrics, Ribbons, Elements And Articles, filed Jan. 13, 2003 (NAN-16); U.S. patent application Ser. No. 10/341,054, Methods Of Using Pre-Formed Nanotubes To Make Carbon Nanotube Films, Layers, Fabrics, Ribbons, Elements And Articles, filed Jan. 13, 2003 (NAN-17); and U.S. patent application Ser. No. 10/341,130, Carbon Nanotube Films, Layers, Fabrics, Ribbons, Elements And Articles, filed Jan. 13, 2003 (NAN-18). In at least some cases, to create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). The nanofabric is patterned using photolithographic techniques generating an electrically conductive trace of nanotubes, NT.

SUMMARY

The present invention provides a process for making bit selectable devices having elements made with nanotubes.

Under one aspect of the invention, a method is used to make a bit selectable device having nanotube memory elements. A structure having at least two transistors is provided, each with a drain and a source with a defined channel region therebetween, each transistor further including a gate over said channel. A trench is formed between one of the source and drain of a first transistor and one of the source and drain of a second transistor. An electrical communication path is formed in the trench between one of the source and drain of a first transistor and one of the source and drain of a second transistor. A defined pattern of nanotube fabric is provided over at least a horizontal portion of the structure and extending into the trench. An electrode is provided in the trench. A pattern of nanotube fabric is suspended so that at least a portion is vertically suspended in spaced relation to the vertical walls of the trench and positioned so that the vertically suspended defined pattern of nanotube fabric is electromechanically deflectable into electrical communication with one of the drain and source of a first transistor and one of the source and drain of a second transistor.

Under another aspect of the invention, a defined pattern of nanotube fabric includes the application of pre-formed nanotubes to create a layer of nanotubes.

Under another aspect of the invention, the layer is substantially a monolayer of nanotubes.

Under another aspect of the invention, the layer is a highly porous fabric of nanotubes.

Under another aspect of the invention, the layer of nanotubes is a conformal fabric of nanotubes.

Under another aspect of the invention, the nanotubes are single walled carbon nanotubes.

Under another aspect of the invention, the suspended length of nanotube fabric has an extent that is sub-lithographic-critical-dimension.

DETAILED DESCRIPTION

The device made by the present invention can be described by its cell size. For a bit selectable, bit erasable cell, a 2T-cell (two transistor) the minimum cell size would be 12 $F^2$, ($F^2$ is a reference to the smallest feature size, squared.) Advantages of using this method include, that most likely no new tooling would be required to perform the methods in a fabrication plant. Nanotubes are dispensed by regular spin-coating and patterned using traditional lithography. Nanotube switching element requires controlled air gap and anchor to structures adjacent to the gap.

Figure 1:
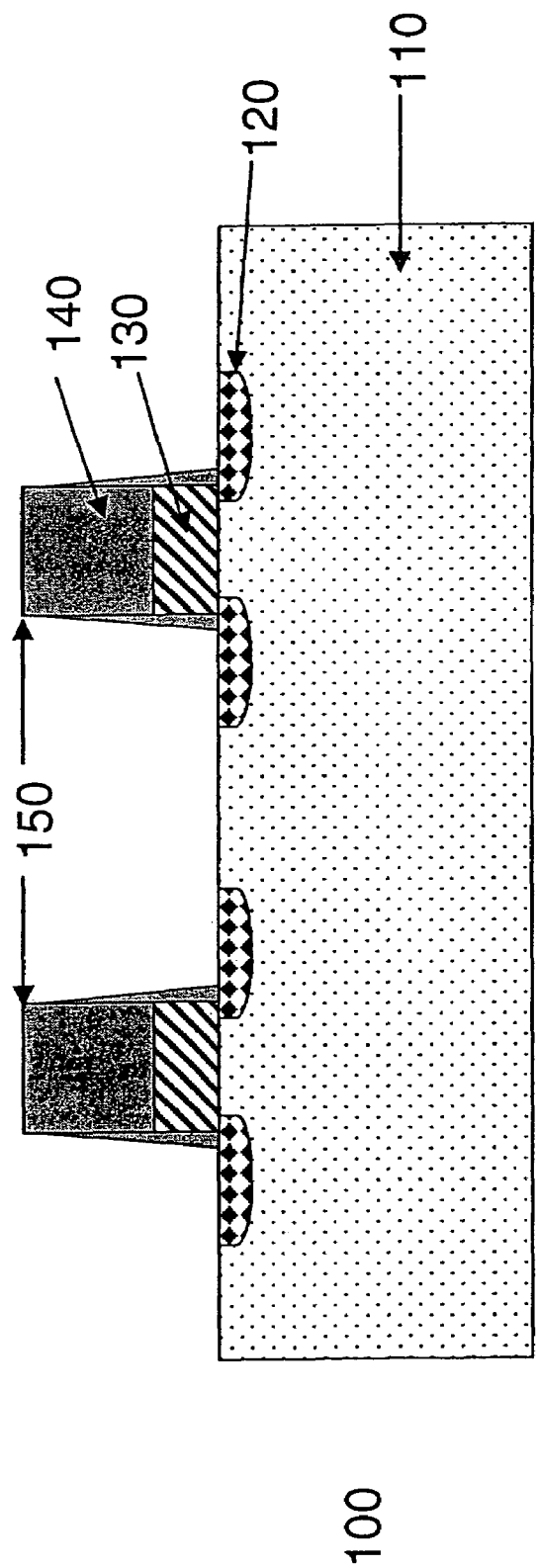
FIGS. 1–24 are figures illustrating sequential steps involved in the methods according to certain embodiments of the invention.

FIG. 1 illustrates a first intermediate structure 100 from a method of fabricating the article according to one aspect of the invention.

A silicon wafer substrate 110, having diffusion regions 120, gates 130 and nitride 140, covering the gates, is provided or created; alternatively, the substrate may be made from any material suitable for use with lithographic etching and electronics. The appropriate ground rule for the following processes is dependent upon the desired device performance and application, but the process flow is compatible with lithographic processes from many microns to sub 100 nm and below. Embedded in substrate 110 are diffusion regions 120. Gate material can be any material suitable for creation of a field effect on the adjacent substrate and source and drain regions, including but not limited to; metals, conductors or semiconductors, including nanofabric made of carbon nanotubes. Gates 130 are covered by first nitride layer 140 or other suitable dielectric, first nitride layer 140 having substantially planar top surface 150.

Figure 2:
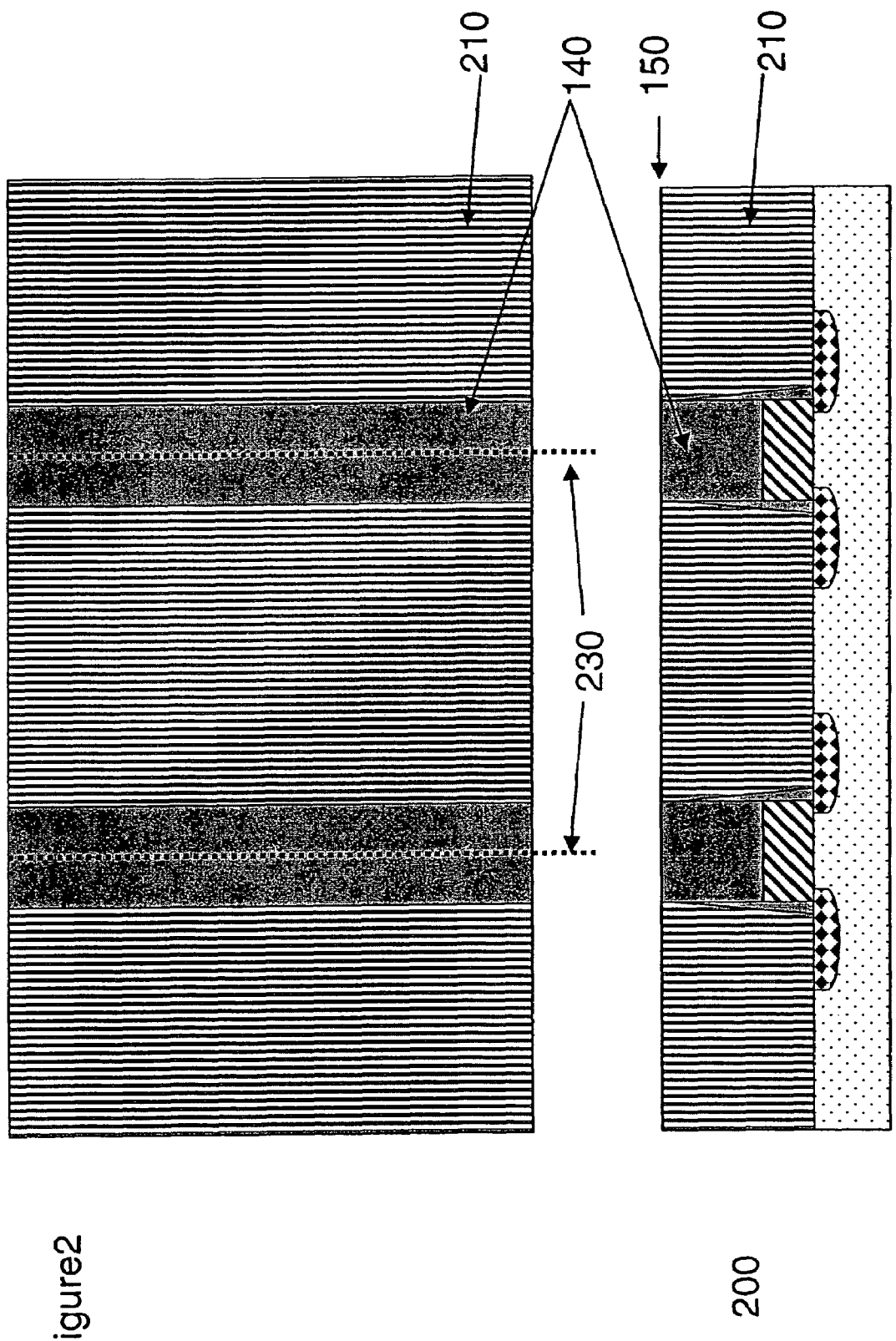

FIG. 2 illustrates intermediate structure 200 in cross sectional view and plan view. Oxide layer 210 is deposited on intermediate structure 100 and is planarized such that the top surface of oxide layer 210 is substantially level with nitride top surface 150, as illustrated: gate direction line 230 is shown as dotted lines.

Figure 3:
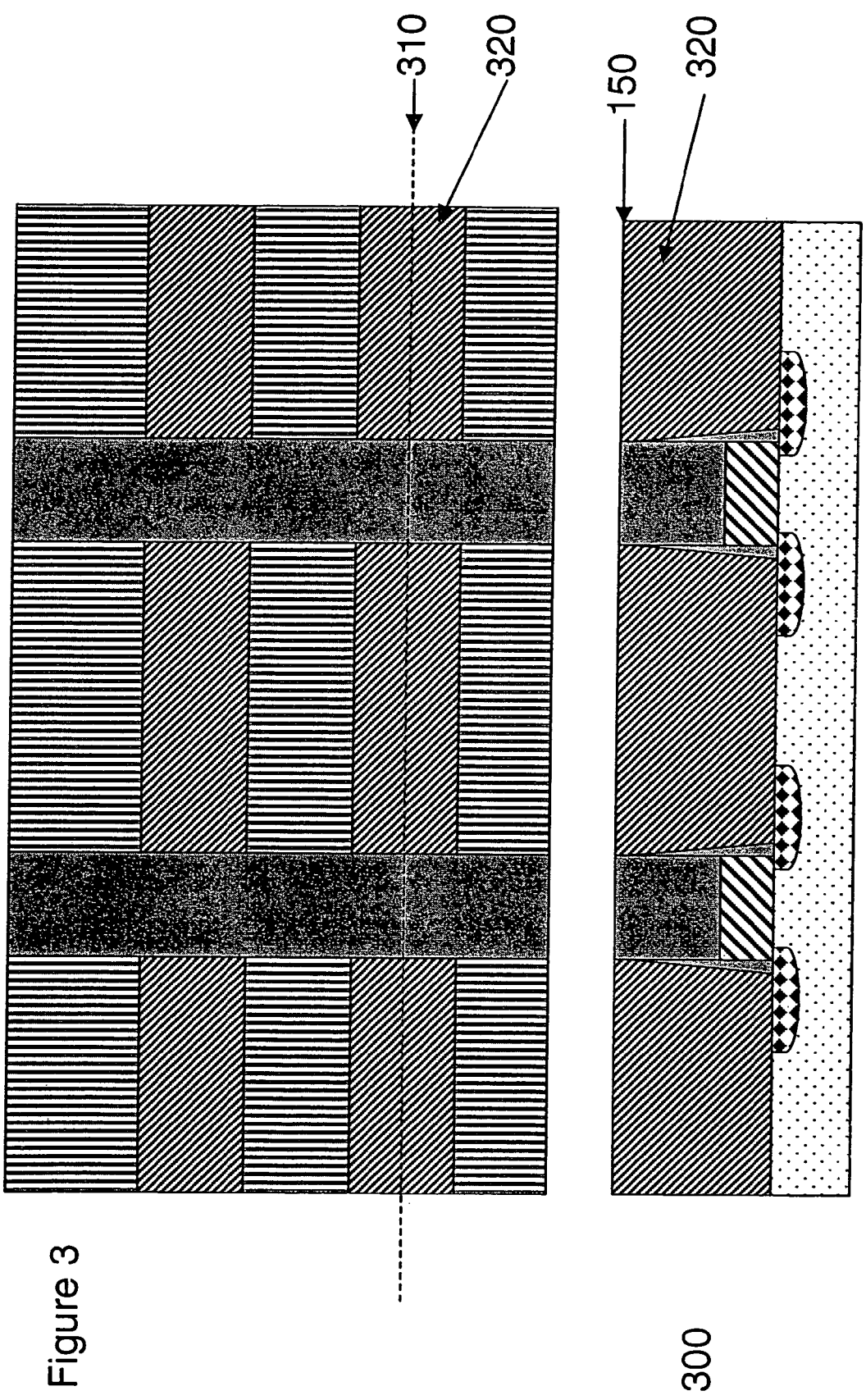

Etch line 310 extending between and adjacent to gates 130 are etched and polysilicon is deposited in the spaces created by etching such that the polysilicon fills the spaces adjacent to gates 130; polysilicon regions 320 are thus created. Etch lines 310 are preferably oriented orthogonally to gate line 230. Alternatively polysilicon regions can be made from other metallic, conducting or semiconducting materials consistent with the desired use of the article. Top surfaces of polysilicon regions 320 are made substantially level with top surface 150, e.g. by CMP (chemical-mechanical polishing), forming intermediate structure 300 as illustrated by FIG. 3. It is not necessary that polysilicon be used for such regions and other materials may be used.

Figure 4:
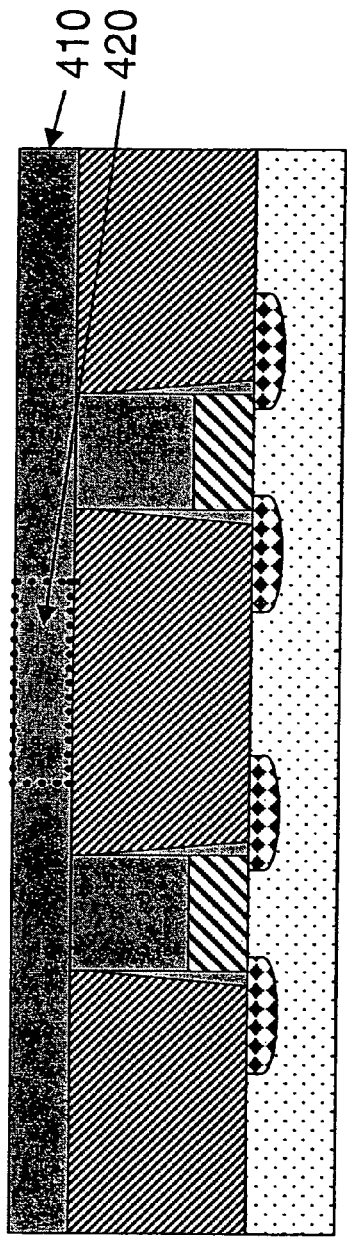
Figure 5:
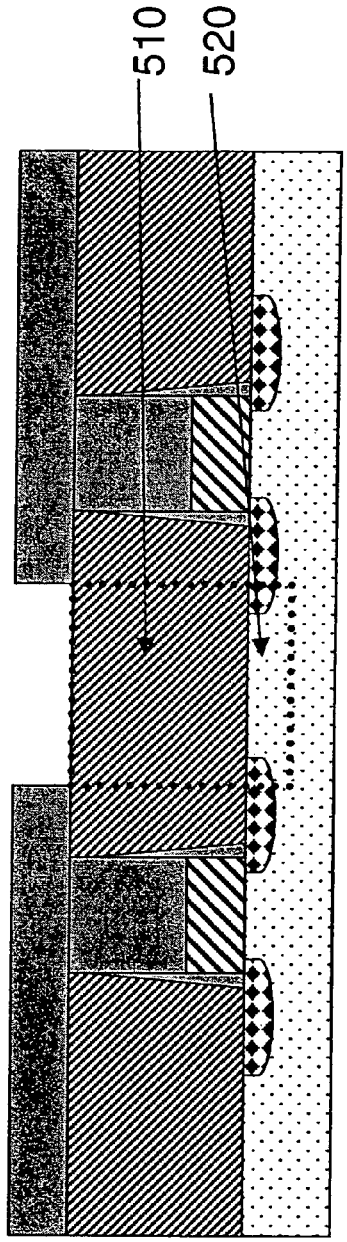

Second nitride layer 410 is applied to intermediate structure 300, forming intermediate structure 400. Exposed nitride 420, shown within dotted lines in FIG. 4, is removed, e.g. by lithographic patterning and etching, forming intermediate structure 500, shown in FIG. 5, (Lithography mask not shown). It is not necessary that this or subsequent "nitride layers" be made of nitride, a suitable material will also serve the desired purpose of protecting nanotubes from subsequent depositions and to create spacers of proper dimensions with selectivity in etching over other elements, e.g. oxide layer 210 and polysilicon region 320.

Figure 6:
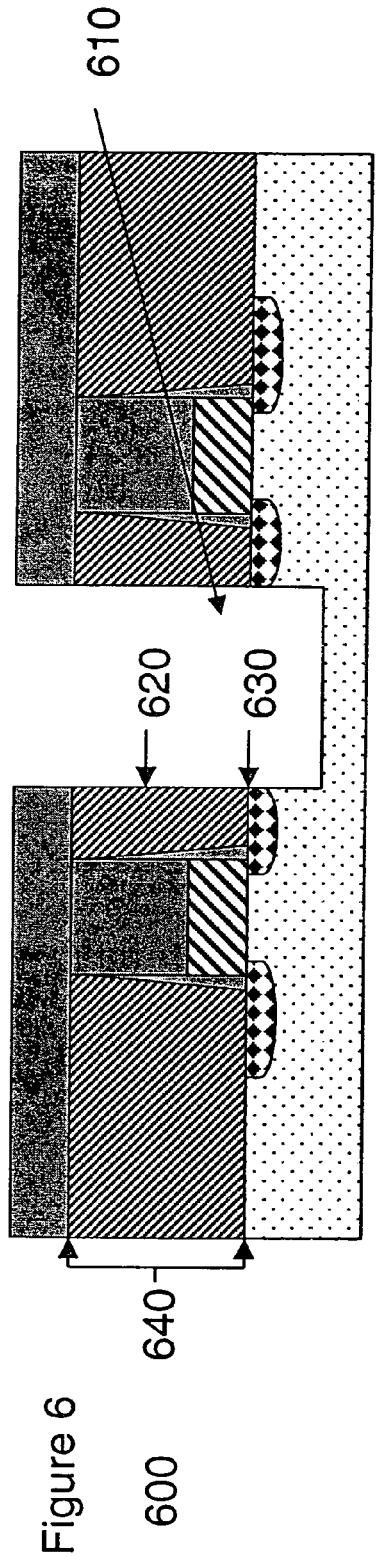

Exposed polysilicon layer 510 (shown within dotted lines) and a region of underlying silicon 520 are removed, e.g. by etching, forming trench 610, and thereby forming intermediate structure 600, as shown in FIG. 6. Alternatively, trench depth can be as deep as approximately the middle of polysilicon region 320, i.e. point 620, the trench may end at substrate interface point 630 or somewhere within the substrate, as shown in FIG. 6. Trench depth will depend on feature size, height 640 and materials used.

Figure 7:
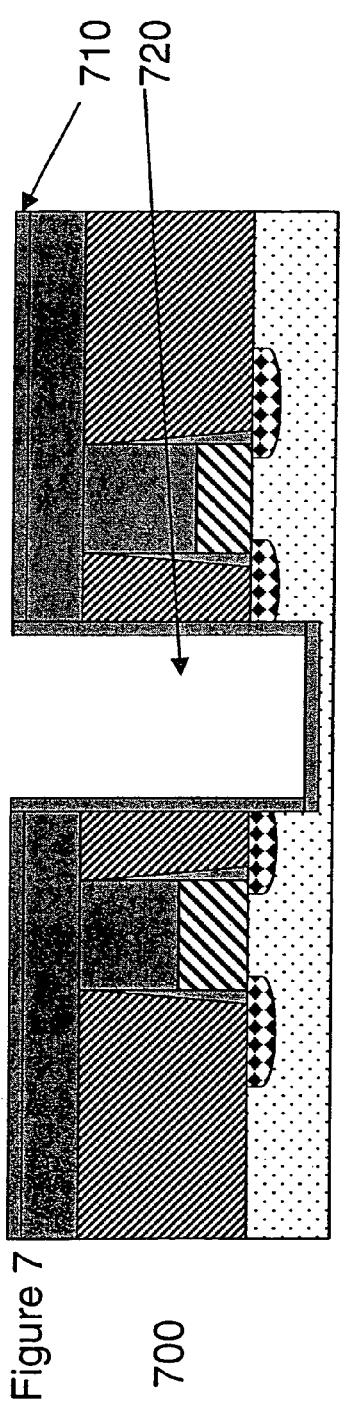

Third nitride layer 710 is deposited over top surfaces of intermediate structure 600, forming intermediate structure 700. Intermediate structure 700 having trench 720, as shown in FIG. 7

Figure 8:
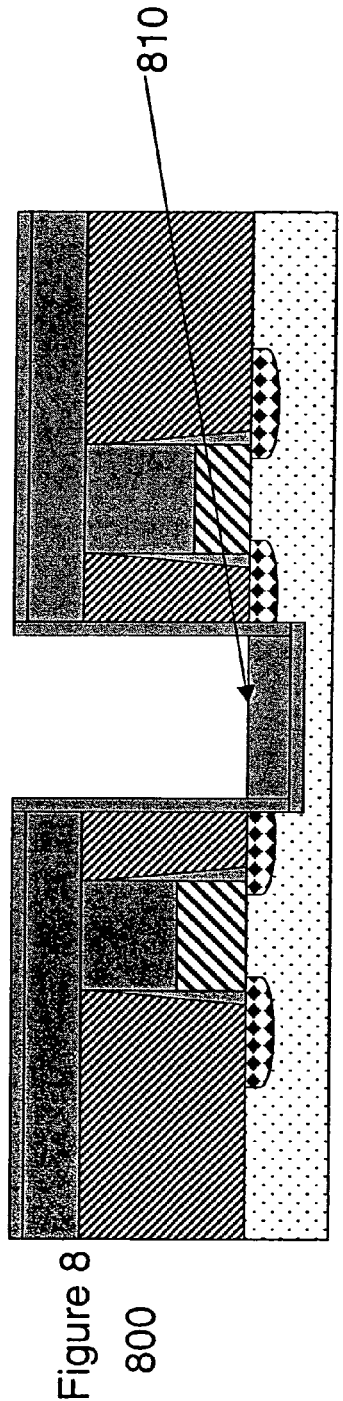

Metal layer 810 is deposited in trench 720 forming intermediate structure 800 as shown in FIG. 8. The deposition can be done in any appropriate manner including by sputtering, chemical vapor deposition (CVD) or by evaporation, followed by etch back if necessary, resulting in intermediate structure 800. Metal 810 may be any suitable conductor or semiconductor depending on the ultimate use of the article.

Figure 9:
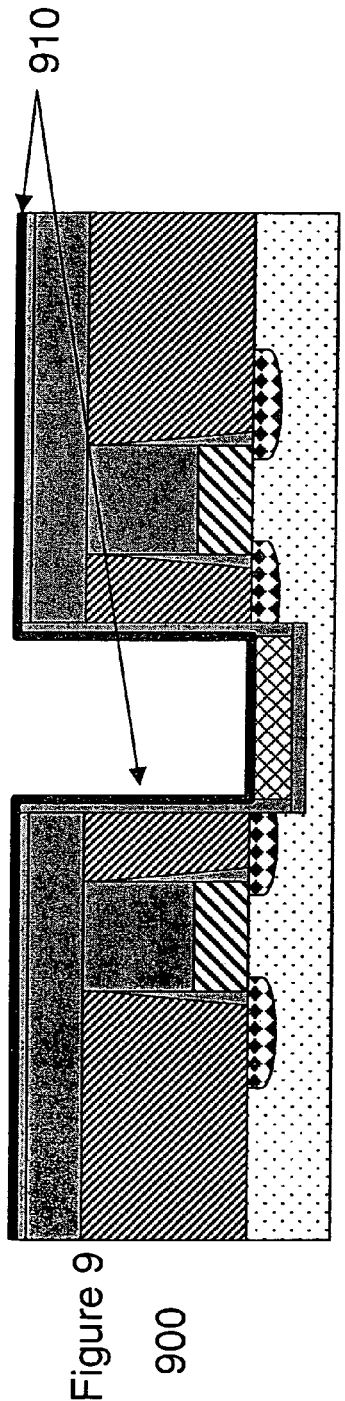
Figure 10:
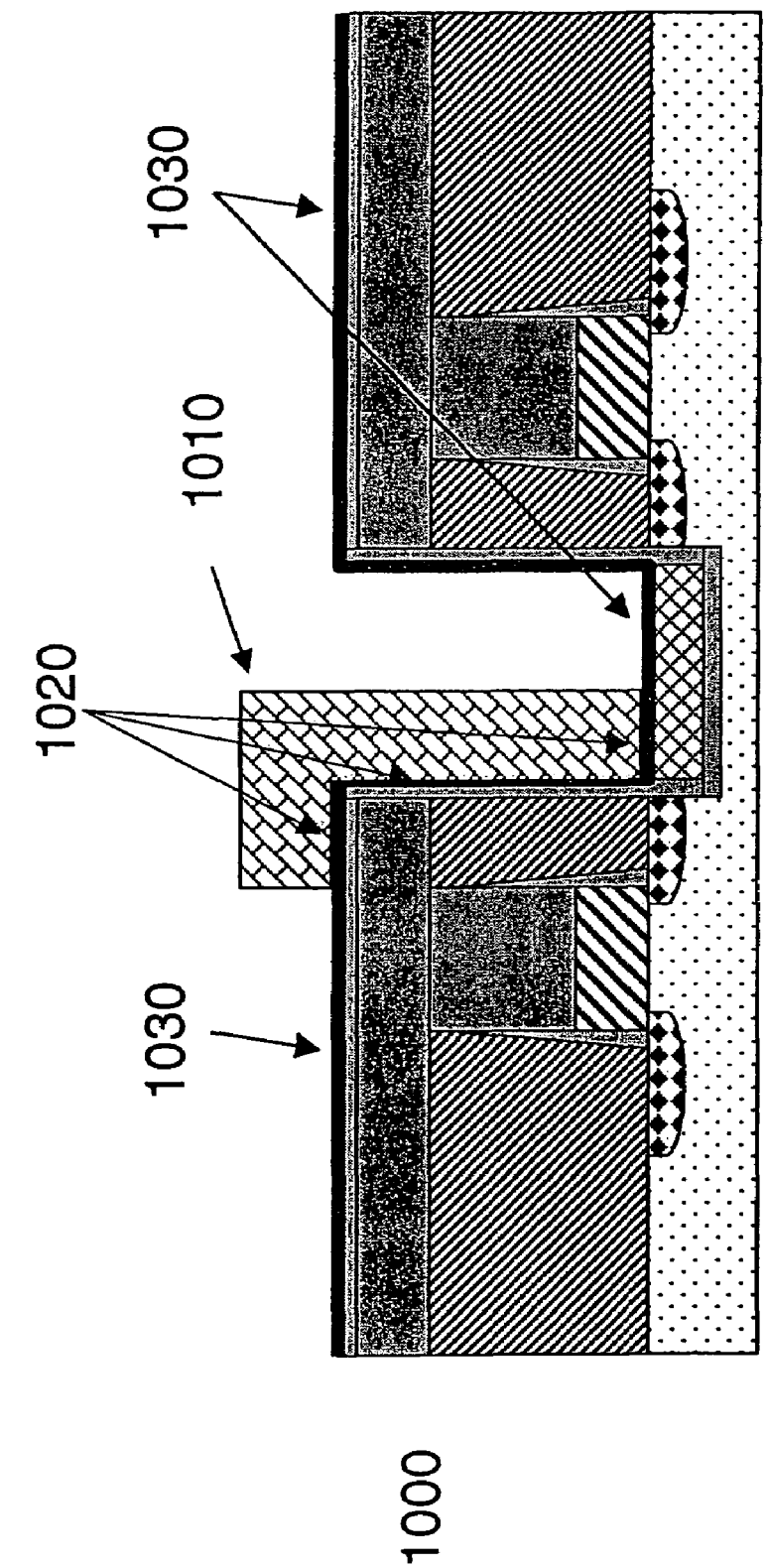
Figure 11:
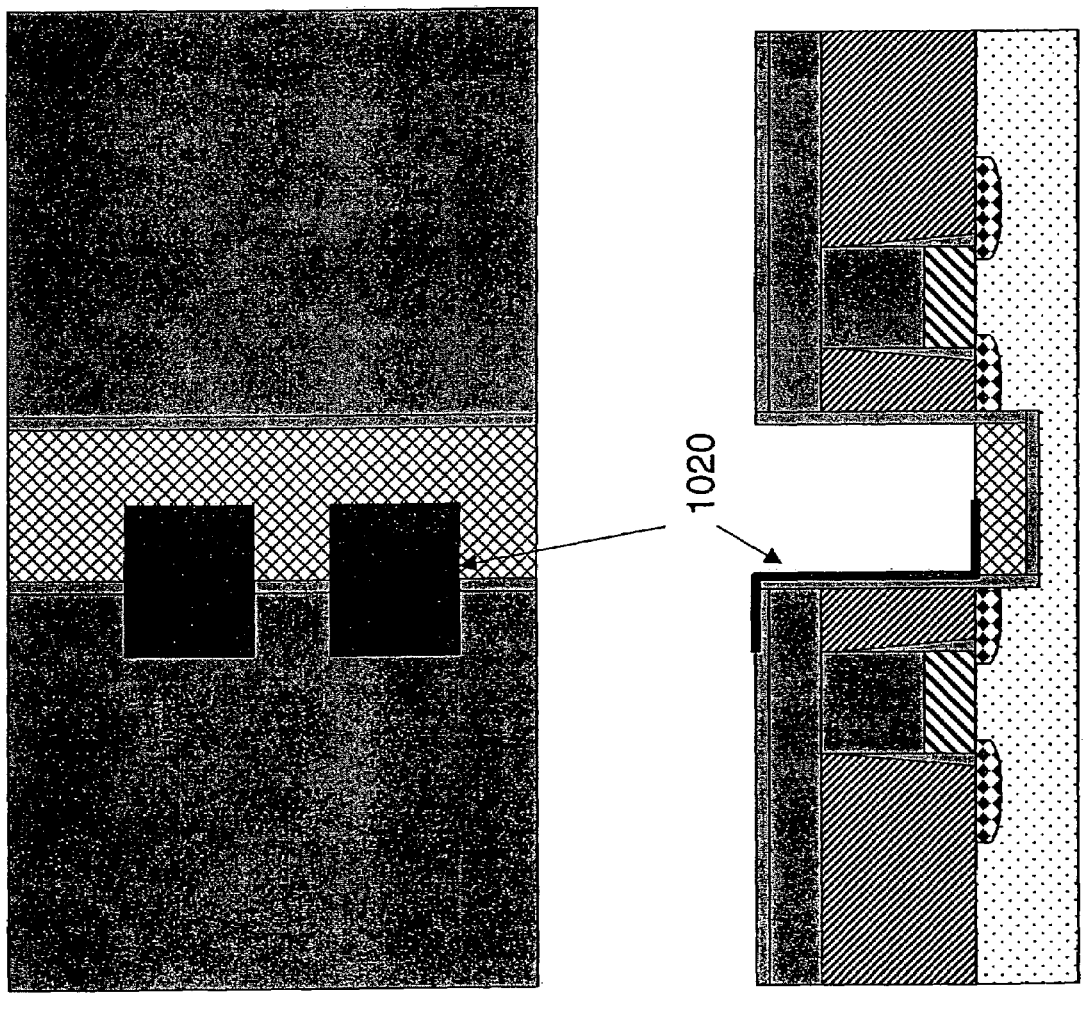

FIGS. 9–11 illustrate patterning of nanofabrics. Nanofabric 910 is applied to intermediate structure 800, thereby creating intermediate structure 900 as shown in FIG. 9. Nanofabrics are preferably created by spin coating a suspension of nanotubes onto a planar or non-planar surface as described in incorporated references Ser. Nos. 10/128,118 and 10/341,005; however nanofabrics may be applied by any appropriate means.

Nanofabric patterning mask 1010 is applied over desired nanofabric sections 1020, as described in Ser. Nos. 09/915,095 and 10/341,005. Exposed nanofabric 1030 is removed, e.g. by ashing, leaving desired nanofabric sections 1020. Mask 1010 is stripped, using an appropriate stripper, such that desired nanofabric sections 1020 and intermediate structure 1000 are left substantially intact, leaving intermediate structure 1100, as shown in FIG. 11. FIG. 11 illustrates cross sectional and plan views of intermediate structure 1100, and especially illustrates the three-dimensionality of nanofabric 910 and that it conforms to a non-planar surface.

Figure 12:
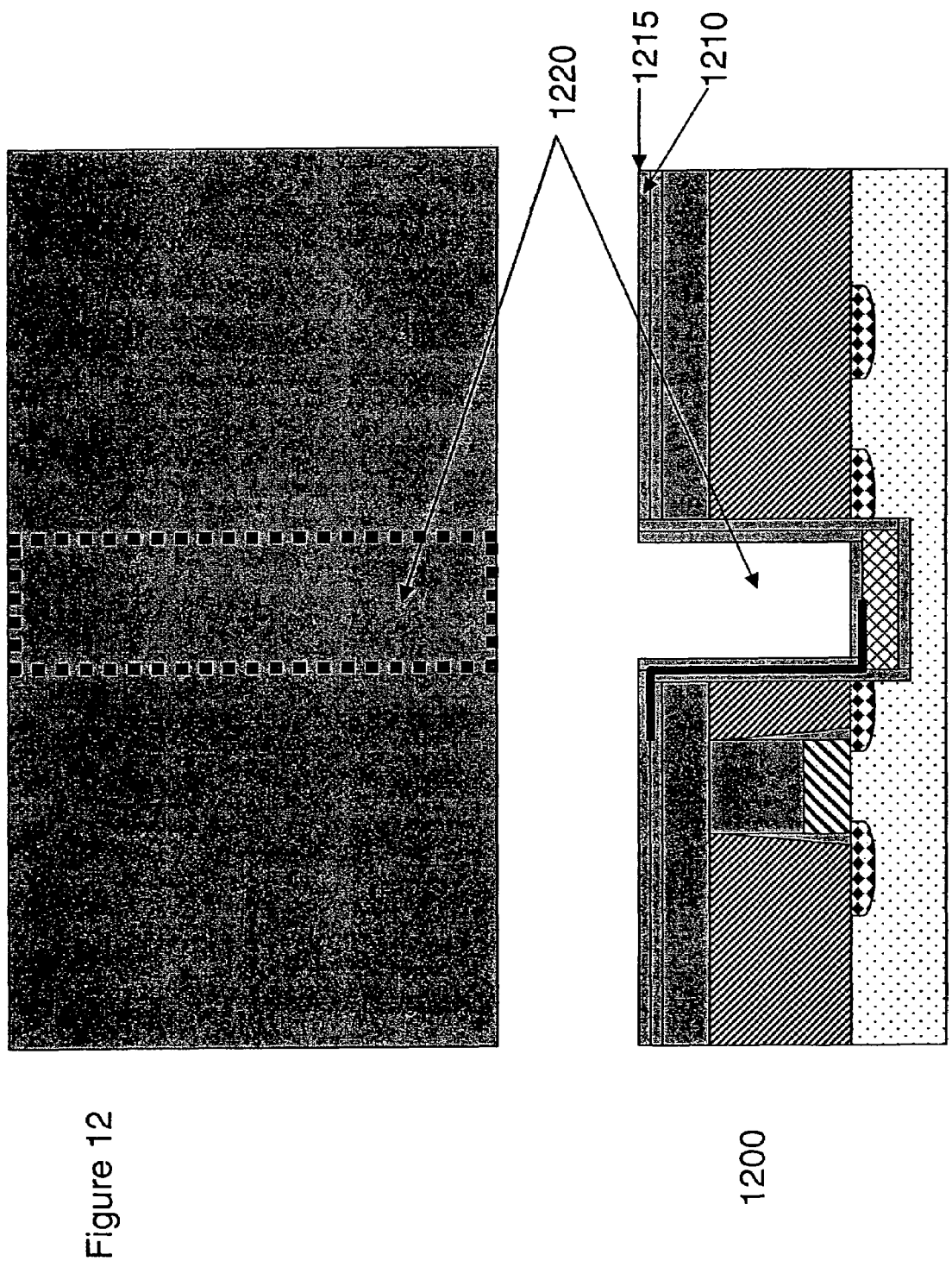

Fourth nitride layer 1210, having top surface 1215, is applied to intermediate structure 1100, creating intermediate structure 1200; intermediate structure 1200 having trench 1220 (shown in plan view within dotted lines), as illustrated in FIG. 12. FIG. 12 illustrates cross sectional and plan views of intermediate structure 1200.

Figure 13:
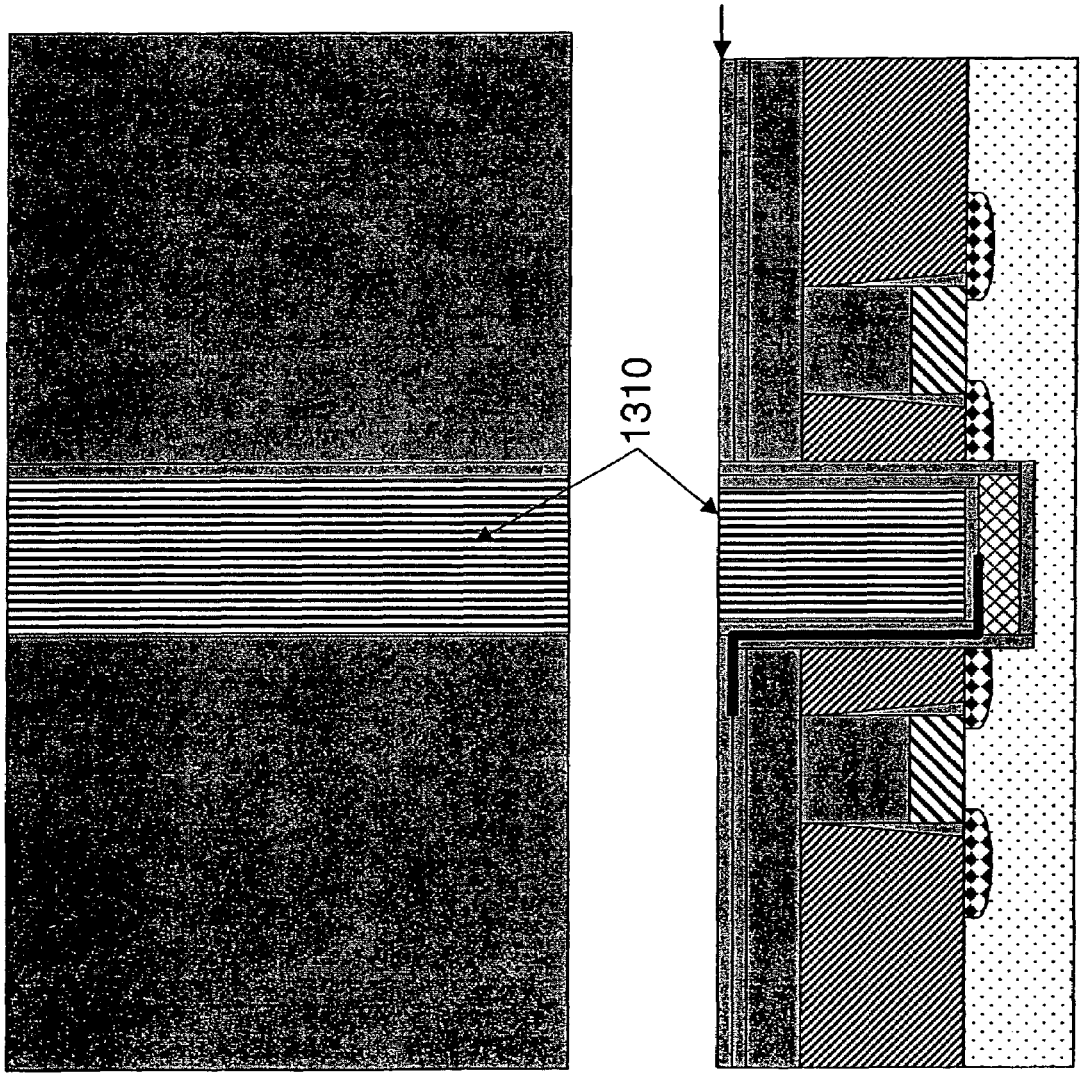

Oxide 1310 is deposited by any appropriate method, e.g. by use of an HDP tool or other appropriate mechanism, into trench 1220. If necessary, excess oxide is removed from top surface 1215 by any appropriate means, e.g. by CMP, such that the exposed top of oxide layer 1310 is substantially level with top surface 1215, thus forming intermediate structure 1300, as illustrated in FIG. 13.

Figure 14:
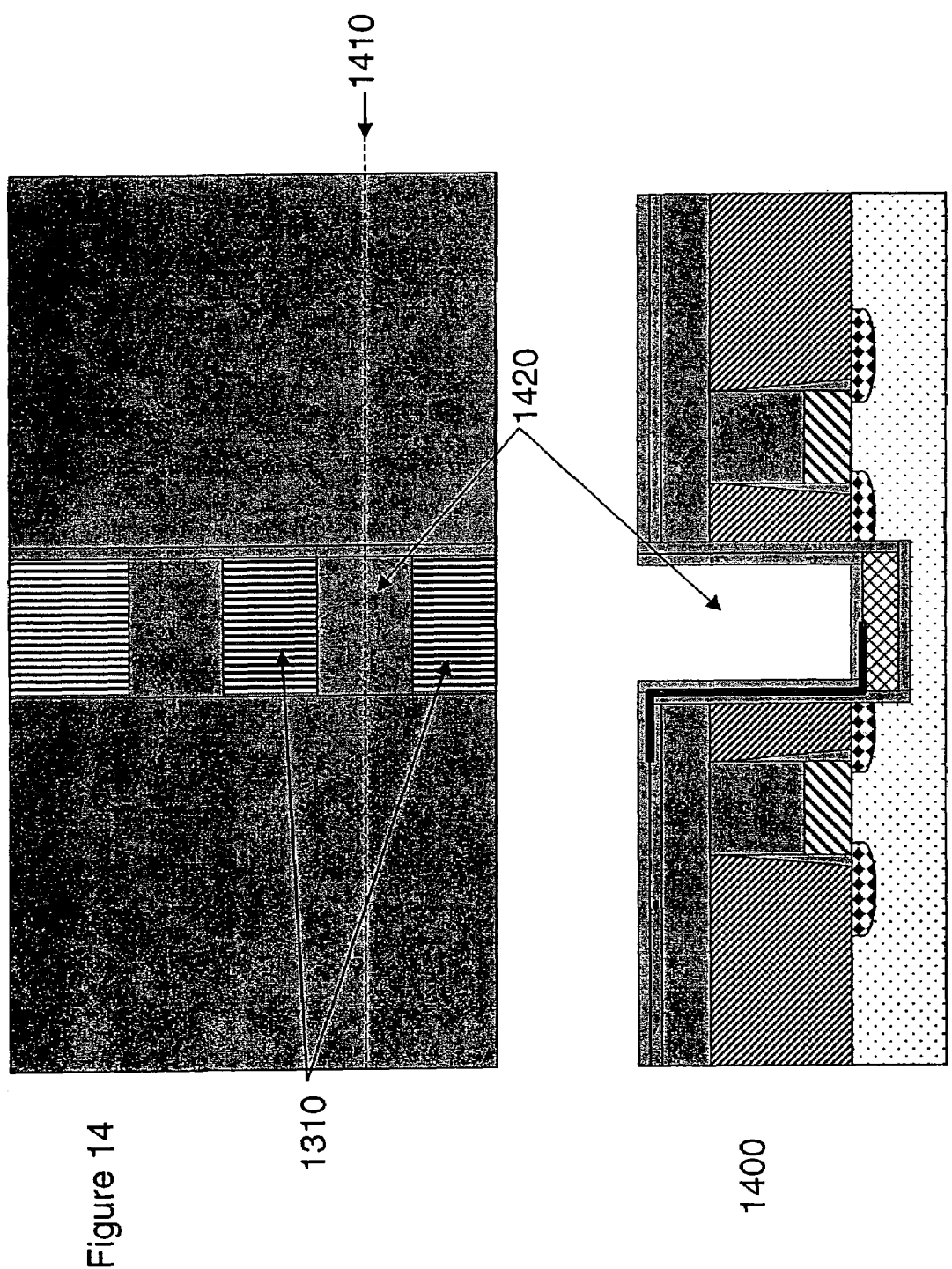

FIG. 14 illustrates a plan view and a cross sectional view (taken at line 1410, shown as a dotted line) of intermediate structure 1400. Oxide 1310 is removed, e.g. by etching from active regions 1420 as illustrated in intermediate structure 1400, e.g. by using a line mask (not shown), line mask would preferably be substantially parallel to etch line 310.

Figure 15:
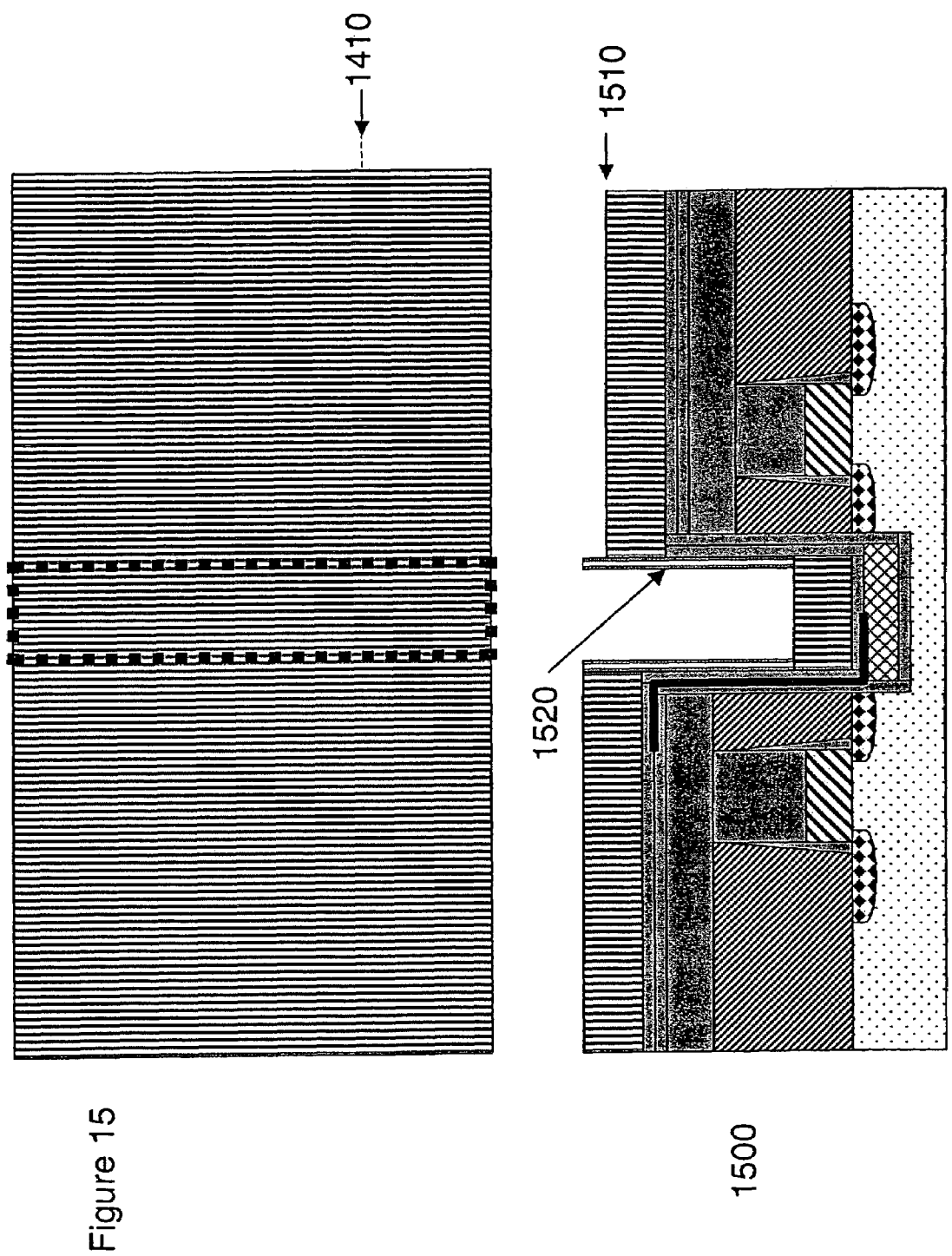

FIG. 15 illustrates a plan and a cross sectional view (taken at line 1410, shown as a dotted line) of intermediate structure 1500. Oxide 1510 is deposited on intermediate structure 1400, e.g. by use of a high density plasma (HDP) tool, forming intermediate structure 1500: oxide 1510 having oxide sidewall 1520.

Figure 16:
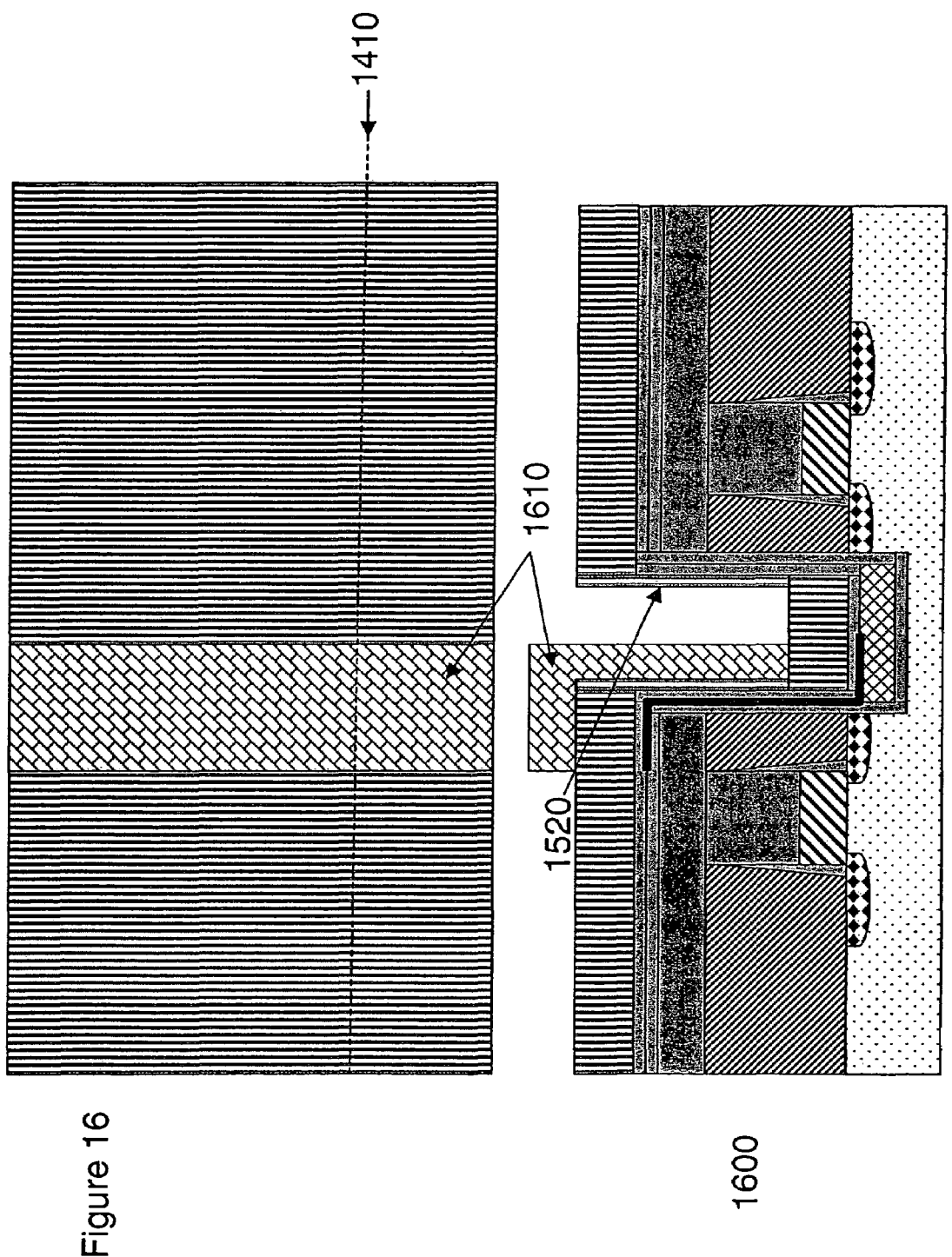

FIG. 16 illustrates a plan and a cross sectional view (taken at line 1410, shown as a dotted line) of intermediate structure 1600. Mask 1610 is applied to intermediate structure 1500, covering approximately one half of active regions 1420, leaving oxide sidewall 1520 exposed, as shown in FIG. 16.

Figure 17:
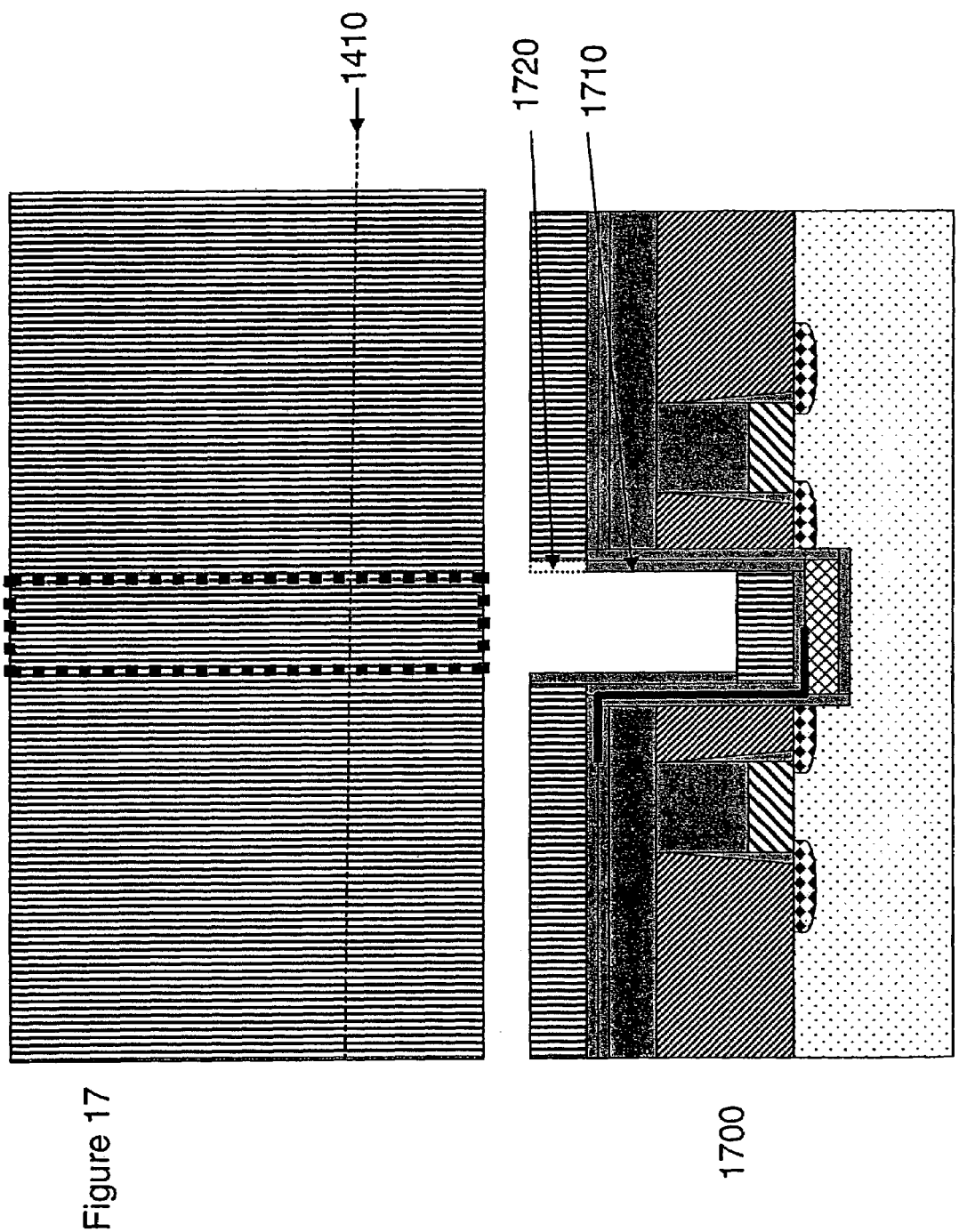

FIG. 17 illustrates a plan view and a cross sectional view (taken at line 1410, shown as a dotted line) of intermediate structure 1700. Oxide sidewall 1520 is removed, e.g. by etching, thereby removing oxide sidewall 1620 and exposing nitride sidewall 1710. Mask 1610 is stripped by any appropriate method, thereby creating intermediate structure 1700.

Figure 18:
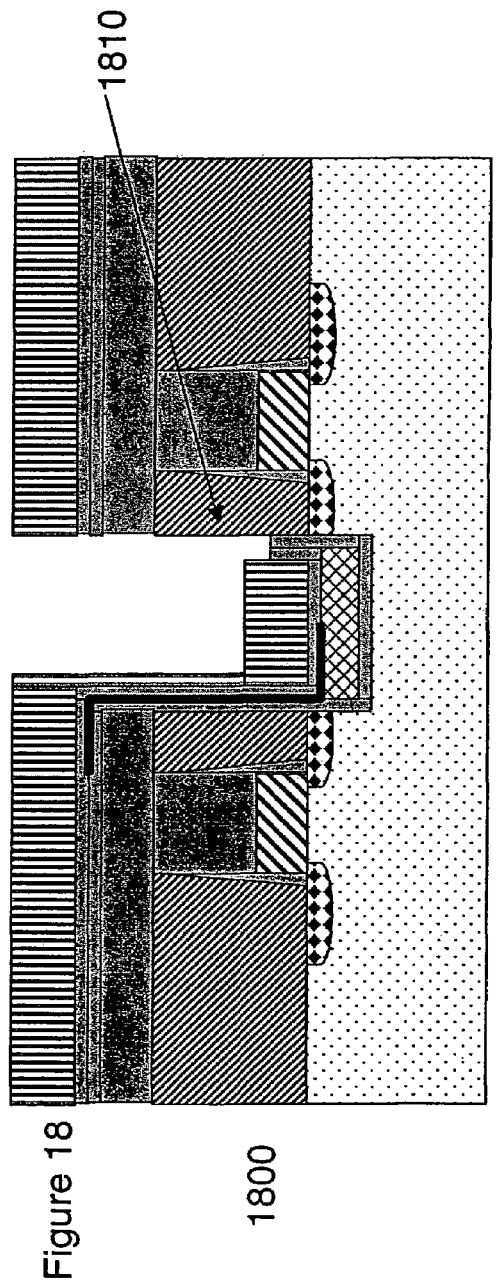

Nitride sidewall 1710 is removed, e.g. by etching to expose contact to source/drain region 1810, thereby creating intermediate structure 1800, as illustrated in FIG. 18. Contact to source/drain region 1810 is analogous to RN in FIG. 25 and is preferably located on release layer side of the structure.

Figure 19:
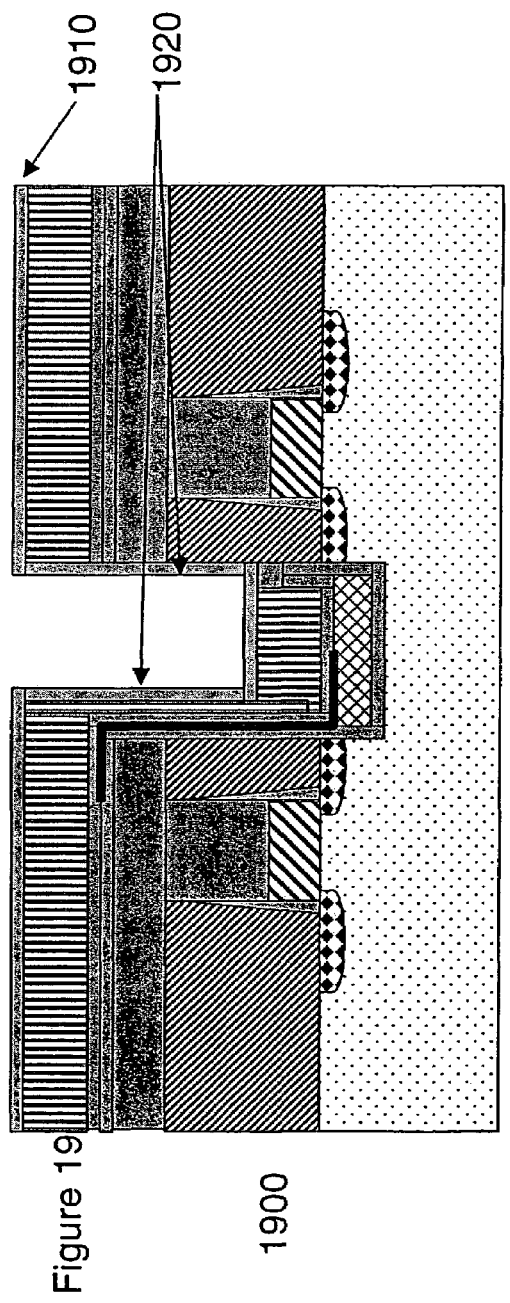

Thin conductor layer 1910 is deposited over intermediate structure 1800, thereby creating intermediate structure 1900 as illustrated in FIG. 19: thin conductive layer 1910 having vertical conductive portions 1920. Thin conductive layer 1910 can be made from any conductive material including but not limited to doped polysilicon.

Figure 20:
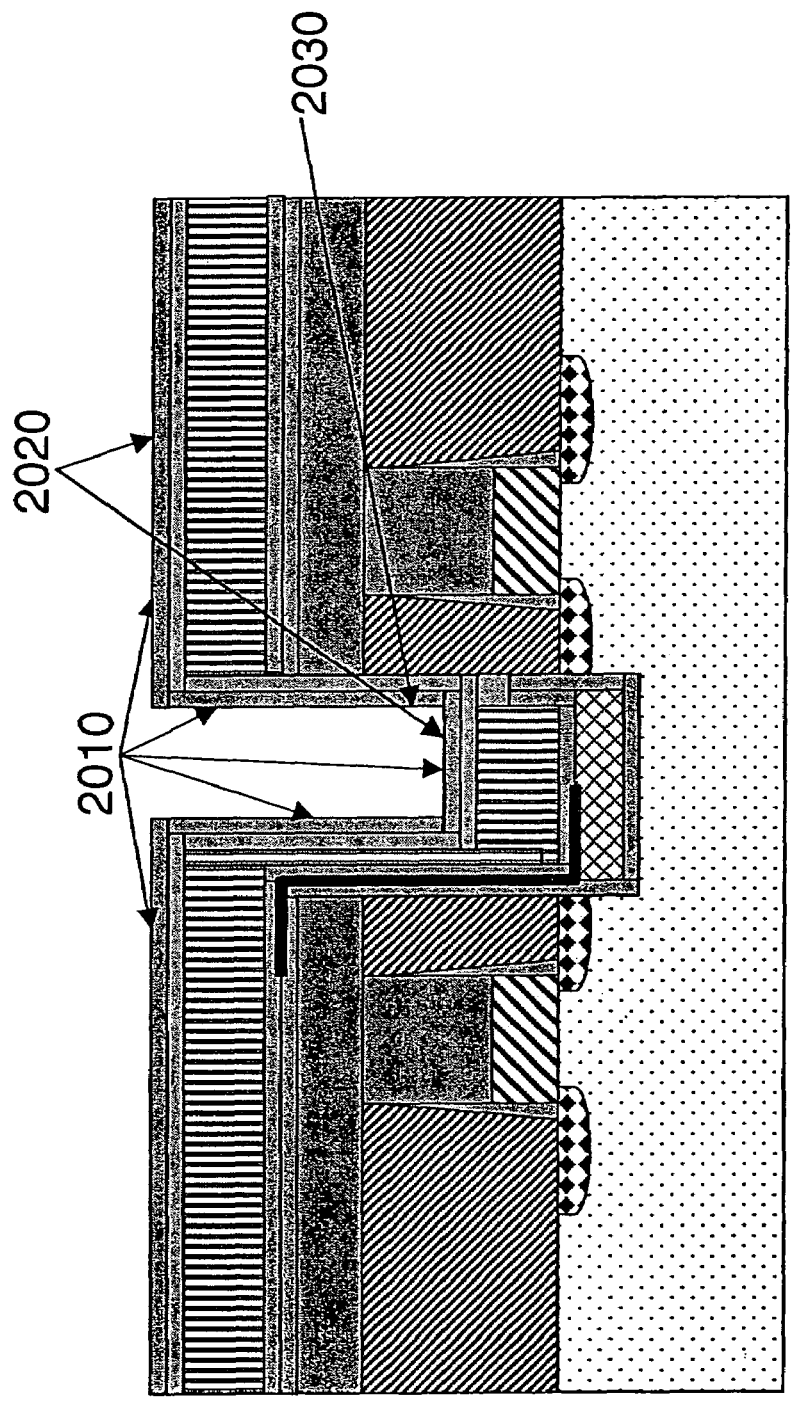

Fifth nitride layer 2010 is deposited over intermediate structure 1900, thereby creating intermediate structure 2000 as illustrated in FIG. 20: fifth nitride layer 2010 having horizontal nitride portions 2020 and vertical nitride portions 2030.

Figure 21:
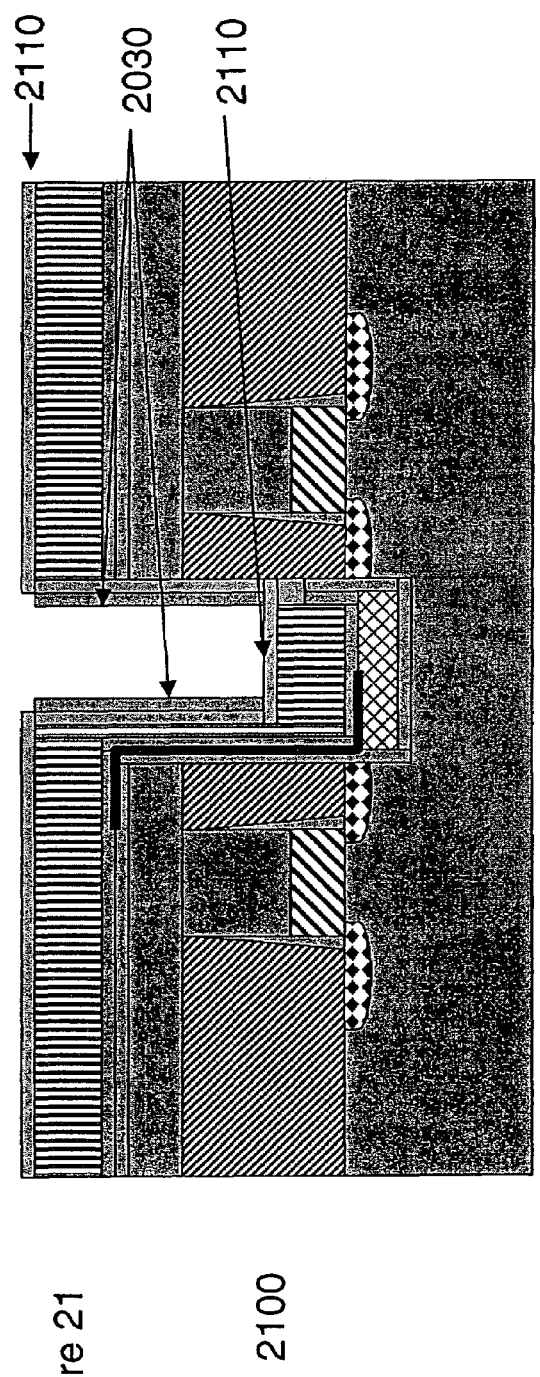

Horizontal nitride portions 2020 are removed, e.g. by directional etching or by reactive ion etching, thereby exposing horizontal conductive portions 2110 and creating intermediate structure 2100, as illustrated by FIG. 21.

Figure 22:
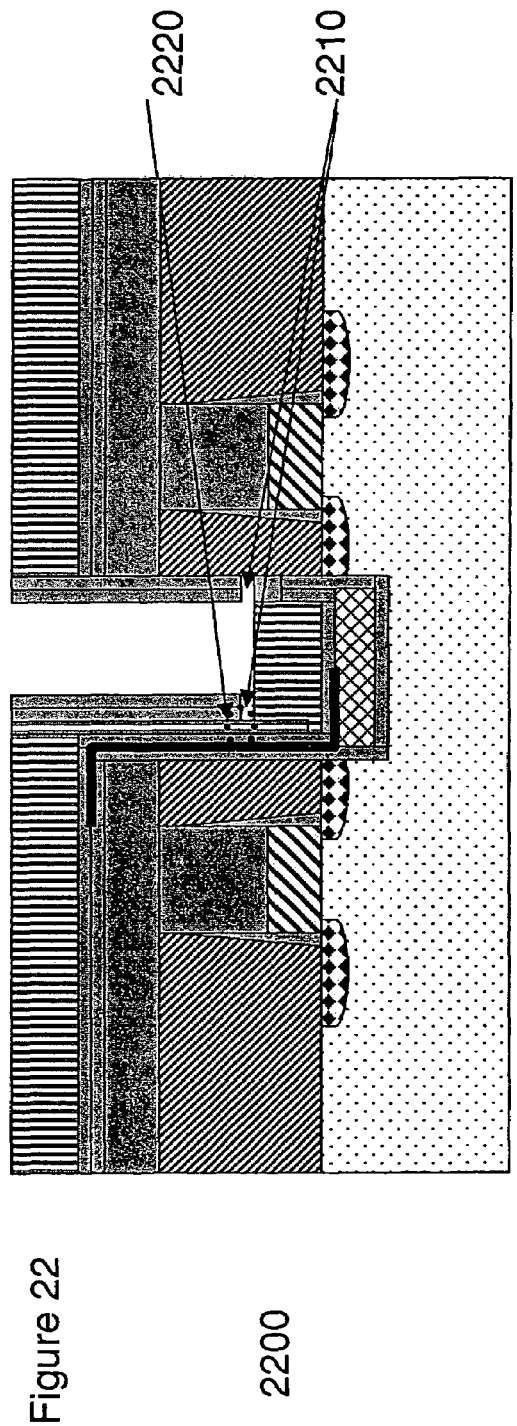

Horizontal conductive portions 2110 are removed, e.g. by etching, thereby creating channels 2210, and exposing exposed oxide portion 2220, thus creating intermediate structure 2200, as illustrated in FIG. 22.

Figure 23:
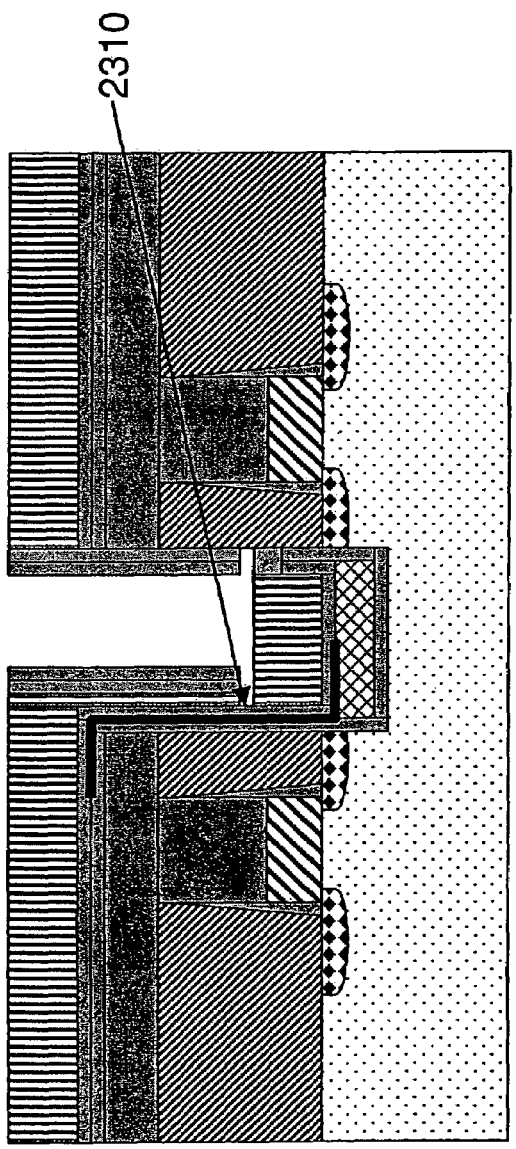

Exposed oxide portion 2220 is removed, e.g. by etching, thereby exposing exposed nitride portions 2310, leaving intermediate structure 2300, as illustrated in FIG. 23.

Figure 24:
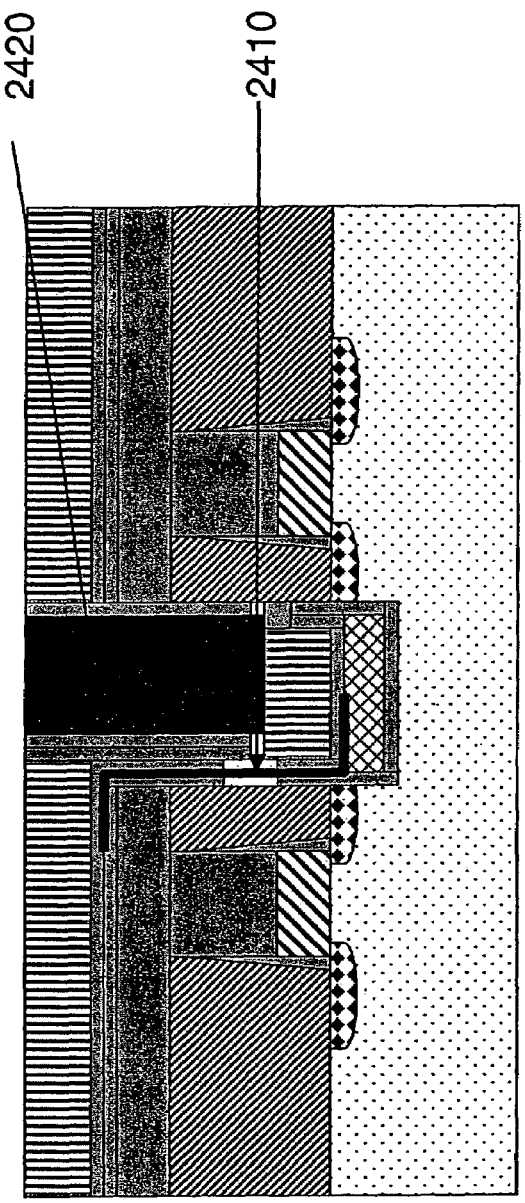

Exposed nitride portions 2310 and vertical nitride portions 2030 are removed, by, e.g. etching, leaving suspended nanofabric portion 2410. Conductive plug 2420 is disposed between vertical conductive portions 1920, thus creating structure 2400 as illustrated by FIG. 24. Conductive plug 2040 is disposed by any appropriate method including, but not limited to deposition and subsequent planarization. Conductive plug 2420 can be made from any appropriate conducting or semiconducting material consistent with the final use of the article. Care should be taken to ensure that the spaces around suspended nanofabric portion 2410 are left substantially free of conductive plug material.

Figure 25:
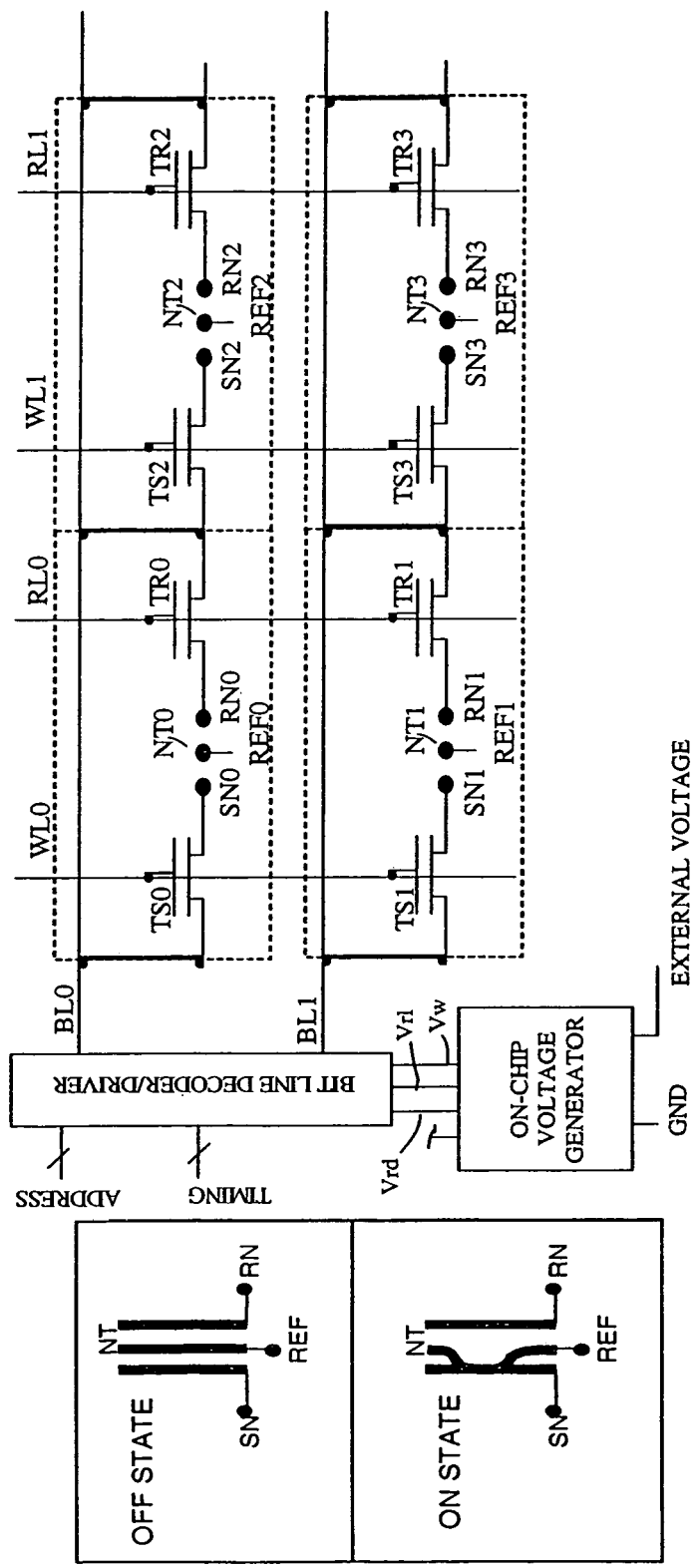
FIG. 25 is a cell layout according to one embodiment of the invention.

FIG. 25 illustrates a Bit-Erasable 12 $F^2$ cell layout wherein switching node (SN), release node (RN) and reference node (REF) form 3 terminals of device. Voltage between SN and REF results in "ON" state (nanotubes flex to contact SN). Voltage between REF and RN results in "OFF" state irrespective of previous state. The voltages on SN and RN are controlled by potential to gates of switching and release transistors, TS and TR, respectively.

Alternate Embodiments

In some embodiments, having a nanofabric ribbon or other nanofabric article disposed adjacent to the movable nanofabric element instead of a metallic electrode permits removal of sacrificial materials from below the top electrode. Note that the electrodes may themselves be formed of nanofabric materials. Fluid may flow through a nanofabric material disposed above a sacrificial layer to remove the sacrificial material. Likewise, the lower electrode may be formed of a nanofabric material if desired.

Under certain preferred embodiments, a nanotube patch has a width of about 180 nm and is strapped, clamped, or pinned to a support preferably fabricated of silicon nitride. The local area of a contact electrode e.g. 620 forms an n-doped silicon electrode and is positioned close to the supports 110 and preferably is no wider than the deflecting nanotube patch, e.g., 180 nm. The relative separation between undeflected nanotube fabric and the contact electrode, (i.e. to the deflected position where the patch attaches to electrode) should be approximately 5–50 nm. The magnitude of the separation is designed to be compatible with electromechanical switching capabilities of the memory device. For this embodiment, the 5–50 nm separation is preferred for certain embodiments utilizing patch made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube patch of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.)

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

The effect of the van der Waals interaction between nanofabrics and other elements can be affected at their interface(s). The effect may be enhanced or diminished; for example, the attractive force can be diminished by coating the surface of the electrode with a thin layer of oxide or other suitable chemicals. Volatile nanoswitches may also be made by employing such techniques instead of or in addition to controlling the gap dimension between a patch and electrode. Such volatile switches may be especially useful in applications such as relays, sensors, transistors, etc.

As the vertical separation between the patch and the underlying electrode increases, the switch becomes volatile when the deflected nanofabric has a strain energy greater than that of the van der Waals force keeping the fabric in contact with the underlying electrode. The thicknesses of insulating layers which control this separation can be adjusted to generate either a non-volatile or volatile condition for a given vertical gap as called for by particular applications with desired electrical characteristics.

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes. Numerous ways have been described, e.g. in the incorporated references, supra, for growing and manufacturing nanofabric articles and materials.

The U.S. Patent Applications, identified and incorporated above, describe several (but not limiting) uses of nanofabrics and articles made therefrom. They also describe various ways of making such nanofabrics and devices. For the sake of brevity, various aspects disclosed in these incorporated references are not repeated here. For example, the various masking and patterning techniques for selectively removing portions of the fabric are described in these applications; in addition, various ways of growing nanofabrics or of forming nanofabrics with preformed nanotubes are described in these applications.

As explained in the incorporated references, a nanofabric may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric Electro-Mechanical Switches, Memory Cells Using Horizontally-Disposed Nanofabric Articles and Methods of Making the Same (U.S. Patent Application Ser. No. 60/446,783) filed Feb. 12, 2003 and Memory Cells Using Vertically-Disposed Nanofabric Articles and Methods of Making the Same (U.S. Patent Application Ser. No. 60/446,786) filed Feb. 12, 2003.

Under certain embodiments, the technique of vertically suspending the nanotube fabric allows the suspended extent to be a function of thin film techniques. As a result, the suspended extent may be shorter than the minimum distances available with the photolithography tools being employed; that is, the suspended extent may be sub-critical-dimension.

Under certain embodiments, the fabric may be highly porous fabric of single-walled carbon nanotubes. Moreover, the fabric may be substantially a monolayer of nanotubes.

The articles formed by preferred embodiments help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

A nanofabric or ribbon has been shown to substantially conform to a surface, such as a surface of an article on a semiconductor substrate. A fabric of nanotubes may be constructed by any appropriate means, including, but not limited to spin coating, direct growth on a suitable substrate or other application. The fabric will be horizontally oriented when the surface of the substrate that receives the fabric is horizontally oriented. The present inventors have appreciated that devices such as electromechanical switches can be constructed using nanofabrics which have conformed to a surface which is substantially perpendicular to a semiconductor substrate (vertically-oriented) and that such devices can be used as vertically oriented switches in a plethora of applications. Fabrication techniques to develop such horizontally- and vertically-disposed fabrics and devices composed of nanotube fabrics which comprise redundant conducting nanotubes may be created via CVD, or by room temperature operations as described herein and described in applications U.S. Ser. Nos. 09/915,093, 09/915,173, 09/915,095, 10/033,323, 10/033,032, 10/128,118, 10/128,117, 10/341,005, 10/341,055, 10/341,054, 10/341,130, Nos. 60/446,783 and 60/446,786, the contents of which are hereby incorporated by reference in their entireties. Such fabrication techniques include the ability to form said switches for use in many different articles having relatively short spans of suspended nanofabric articles. In some embodiments, this allows smaller device dimensions and higher strains in the nanofabric articles, as well as lower electrical resistances. Such articles may be adapted or modified to perform logic functions or be part of a scheme involving logical functionality.

Volatile and non-volatile switches, and switching elements of numerous types of devices, can be thus created. In certain preferred embodiments, the articles include substantially a monolayer of carbon nanotubes. In certain embodiments the nanotubes are preferred to be single-walled carbon nanotubes. Such nanotubes can be tuned to have a resistance between 0.2–100 kOhm/□ or in some cases from 100 kOh/□ to 1 GOhm/□.

The logic circuitry of the present invention generally operate using non-volatile operation/switching of nanotubes, although non-volatile operation of nanofabric switches is within the scope of the present invention. In addition, coordination of volatile and non-volatile elements may be advantageous for generating simultaneously logic and memory functions or as part of an overall logic functionality. It is CMOS built with only nanoelectromechanical nanofabric structures constructed with carbon nanotubes. It does not necessarily draw DC current and may only dissipate power when it switches.

It will be further appreciated that the scope of the present invention is not limited to the above-described embodiments but rather is defined by the appended claims, and that these claims will encompass modifications and improvements to what has been described.

The invention claimed is:

1. A method of making a bit selectable device having nanotube memory elements, comprising:
   providing a structure having at least two transistors, each with a drain and a source with a defined channel region therebetween, each transistor further including a gate over said channel;
   forming a trench between one of the source and drain of a first transistor and one of the source and drain of a second transistor;
   forming an electrical communication path in the trench between one of the source and drain of a first transistor and one of the source and drain of a second transistor;
   providing a defined pattern of nanotube fabric over at least a horizontal portion of the structure and extending into the trench;
   providing an electrode in the trench;
   suspending defined pattern of nanotube fabric so that at least a portion is vertically suspended in spaced relation to the vertical walls of the trench and positioned so that the vertically suspended defined pattern of nanotube fabric is electromechanically deflectable into electrical communication with one of the drain and source of a first transistor and one of the source and drain of a second transistor.

2. The method of claim 1 wherein the providing of a defined pattern of nanotube fabric includes the application of pre-formed nanotubes to create a layer of nanotubes.

3. The method of claim 2 wherein the layer is substantially a monolayer of nanotubes.

4. The method of claim 2 wherein the layer is a highly porous fabric of nanotubes.

5. The method of claim 2 wherein the layer of nanotubes is a conformal fabric of nanotubes.

6. The method of claim 2 wherein the nanotubes are single walled carbon nanotubes.

7. The method of claim 1 wherein the suspended length of nanotube fabric has an extent that is sub-lithographic-critical-dimension.

* * * * *